(12) United States Patent
Rahimo et al.

(10) Patent No.: US 12,349,429 B2
(45) Date of Patent: Jul. 1, 2025

(54) SEMICONDUCTOR DEVICE AND METHOD FOR PRODUCING SAME

(71) Applicant: mqSemi AG, Zug (CH)

(72) Inventors: Munaf Rahimo, Gaensbrunnen (CH); Iulian Nistor, Niederweningen (CH)

(73) Assignee: MQSEMI AG, Zug (CH)

( * ) Notice: Subject to any disclaimer, the term of this patent is extended or adjusted under 35 U.S.C. 154(b) by 50 days.

(21) Appl. No.: 18/471,353

(22) Filed: Sep. 21, 2023

(65) Prior Publication Data
US 2024/0063267 A1    Feb. 22, 2024

Related U.S. Application Data

(63) Continuation of application No. 16/987,960, filed on Aug. 7, 2020, now Pat. No. 11,804,524.

(30) Foreign Application Priority Data

Aug. 8, 2019   (GB) ...................................... 1911357

(51) Int. Cl.
*H10D 62/17*    (2025.01)
*H10D 12/00*    (2025.01)
(Continued)

(52) U.S. Cl.
CPC ......... *H10D 62/393* (2025.01); *H10D 12/038* (2025.01); *H10D 12/481* (2025.01);
(Continued)

(58) Field of Classification Search
CPC ............. H01L 29/1095; H01L 29/4236; H01L 29/1004; H01L 29/66348; H01L 29/7397;
(Continued)

(56) References Cited

U.S. PATENT DOCUMENTS

| | | |
|---|---|---|
| 6,337,498 B1 | 1/2002 | Hasegawa |
| 6,380,586 B1 | 4/2002 | Yoshikawa |

(Continued)

OTHER PUBLICATIONS

Kang et al. "Trench emitter IGBT with lateral and vertical MOS channels" (Proc. 23rd Internat. Conf. on Microelectronics MIEL 2002, 163-166).

(Continued)

*Primary Examiner* — Britt D Hanley
*Assistant Examiner* — Victor V Barzykin
(74) *Attorney, Agent, or Firm* — Tarolli, Sundheim, Covell & Tummino LLP

(57) ABSTRACT

A Metal Oxide Semiconductor (MOS) cell design has traditional planar cells extending in a first dimension, and trenches with their length extending in a third dimension, orthogonal to the first dimension in a top view. The manufacturing process includes forming a horizontal channel, and a plurality of trenches discontinued in the planar cell regions. Horizontal planar channels are formed in the mesa of the orthogonal trenches. A series connected horizontal planar channel and a vertical trench channel are formed along the trench regions surrounded by the first base. The lack of a traditional vertical channel is important to avoid significant reliability issues (shifts in threshold voltage Vth). The planar cell design offers a range of advantages both in terms of performance and processability. Manufacture of the planar cell is based on a self-aligned process with minimum number of masks, with the potential of applying additional layers or structures.

12 Claims, 35 Drawing Sheets

(51) Int. Cl.
*H10D 12/01* (2025.01)
*H10D 30/69* (2025.01)
*H10D 62/10* (2025.01)
*H10D 64/27* (2025.01)
*H01L 21/265* (2006.01)
*H01L 21/266* (2006.01)
*H10D 62/13* (2025.01)

(52) U.S. Cl.
CPC ......... *H10D 30/697* (2025.01); *H10D 62/127* (2025.01); *H10D 62/177* (2025.01); *H10D 64/513* (2025.01); *H01L 21/26513* (2013.01); *H01L 21/266* (2013.01); *H10D 62/142* (2025.01)

(58) Field of Classification Search
CPC ......... H01L 29/42348; H01L 21/26513; H01L 21/266; H10D 12/038; H10D 12/481; H10D 30/697; H10D 62/127; H10D 62/142; H10D 62/393; H10D 62/177; H10D 64/513
See application file for complete search history.

(56) References Cited

U.S. PATENT DOCUMENTS

| | | |
|---|---|---|
| 8,441,046 B2 | 5/2013 | Bobde |
| 9,064,925 B2 | 6/2015 | Rahimo |
| 9,093,522 B1 * | 7/2015 | Zeng ................. H01L 29/66348 |
| 9,640,644 B1 | 5/2017 | Chen |
| 2002/0175351 A1 | 11/2002 | Baliga |
| 2007/0080379 A1 | 4/2007 | Peake |
| 2017/0243961 A1 | 8/2017 | Lu |
| 2018/0261666 A1 | 9/2018 | Zeng |

OTHER PUBLICATIONS

Zeng et al. "Numerical analysis of a trench VDMOST structure with no quasi-saturation" (Solid State Electronics, vol. 38, No. 4, p. 821-828, 1995).

Spulber et al. "A novel gate geometry for the IGBT: the trench planar insulated gate bipolar transistor (TPIGBT)" (IEEE Electron Device Letters, vol. 20, No. 11, Nov. 1999, p. 580).

* cited by examiner

SEMICONDUCTOR DEVICE AND METHOD FOR PRODUCING SAME

CROSS-REFERENCE TO RELATED APPLICATIONS

The present application is a continuation of U.S. application Ser. No. 16/987,960, filed 8 Aug. 2020, which claims priority to GB Patent Application No. 1911357.0 filed on 8 Aug. 2019. The entireties of which are hereby incorporated herein by reference.

TECHNICAL FIELD

The invention relates to the field of power semiconductor devices. It relates to a power semiconductor device with layers of different conductivity types and a method for producing such a semiconductor device.

BACKGROUND

Planar and Trench MOS cell designs exhibit a number of advantages and disadvantages for IGBT and MOSFET designs. For IGBTs, typical Planar and Trench designs are shown in FIGS. 1A and 2A. Both designs can incorporate an enhancement n-type layer for improved excess carrier storage as shown in FIGS. 1B and 2B.

FIG. 1A shows a prior art IGBT with planar gate electrodes. The IGBT 200 is a device with a four-layer structure, which are arranged between an emitter electrode 3 on an emitter side 31 and a collector electrode 2 on a collector side 21, which is arranged opposite of the emitter side 31. An (n-) doped drift layer 4 is arranged between the emitter side 31 and the collector side 21. A p doped planar base layer 9 is arranged between the drift layer 4 and the emitter electrode 3, which planar base layer 9 is in direct electrical contact to the emitter electrode 3. A planar n-doped source region 7 is arranged on the emitter side 31 embedded into the planar base layer 9 and contact opening 14 to the emitter electrode 3. In addition, a planar p doped region 8 arranged on the emitter side 31 below region 7 and embedded into the planar base layer 9 and contact opening 14 through region 7 and extending to region 8 is formed for the emitter electrode 3.

A planar gate electrode 10 is arranged on top of the emitter side 31. The planar gate electrode 10 is electrically insulated from the planar base layer 9, the planar source region 7 and the drift layer 4 by a planar insulating layer 12. There is a further insulating layer 13 arranged between the planar gate electrode 10 and the emitter electrode 3.

The planar cell concept offers a lateral MOS channel 15 which suffers from non-optimal charge spreading (so called JFET effect) near the cell resulting in low carrier enhancement and higher conduction losses. Furthermore, due to the lateral channel design, the planar cell design suffers also from the PNP bipolar transistor hole drain effect (PNP effect) due to the bad spreading of electrons flowing out of the MOS channel. However, the accumulation layer between the MOS cells offers strong charge enhancement for the PIN diode part (PIN effect). The planar design also requires more area resulting in less cell packing density for reduced channel resistance.

On the other hand, the planar design provides good blocking capability due to low peak fields at the cell and in between. The planar design can also provide good controllability and low switching losses and the cell densities in planar designs are easily adjusted for the required short circuit currents. Due to the fact that there exist few high peak electric fields in the gate oxide regions, the planar design offers good reliability with respect to parameter shifting during operation under high voltages. Also, the introduction of enhanced layers in planar cells as shown in FIG. 1B has resulted in lower losses rivalling those achieved with trench designs as explained below.

The trench cell concept for a trench IGBT 300 shown in FIG. 2B offers a vertical MOS channel 16 which provides enhanced injection of electrons in the vertical direction and suffer from no drawbacks from charge spreading (JFET effect) near the cell. Therefore, the trench cells show much improved carrier enhancement for lower conduction losses. Due to the vertical channel design, the trench offers also less hole drain effect (PNP effect) due to the improved electron spreading out of the MOS channel. Modern trench designs adopting mesa widths (trench to trench distance) below 1 µm achieve very low conduction losses since closely packed trenches can provide a strong barrier to hole drainage. Matching such a performance with less complex processes can be of a great advantage. The accumulation layer at the bottom of the trench offers strong charge enhancement for the PIN diode part. Hence wide and/or deep trenches show optimum performance. Furthermore, the trench design offers large cell packing density for reduced channel resistance.

However, the trench design suffers from lower blocking capability near the bottom corners of the trenches due to high peak electric fields. This has also resulted in parameter shifting during operation due to hot carrier injection into the gate oxide. The trench design has also a large MOS accumulation region and associated capacitance resulting in bad controllability and high switching losses. The high cell densities in trench designs will also result in high short circuit currents. Finally, gate parameter shifts can occur under normal gate biasing stress conditions due to the trench etch process in relation to the silicon crystal orientation and the critical region at the n-source and p-base junction which is formed at the trench gate oxide 12' and defines the device MOS parameters.

Hence, optimizing the trench design to overcome the above drawbacks has normally resulted in higher losses when compared to the initial loss estimations and potential of trench designs. Many trench designs have been proposed with particular focus on the regions between the active MOS cells for lowering the losses and improving the device controllability. Another approach in previous inventions combines planar and trench designs. This was proposed to obtain the advantage of the planar designs (region between the cells) and trench designs (the cell) while eliminating some of the drawbacks of the planar and trench designs.

In U.S. Pat. No. 9,064,925B2, the Trench Planar IGBT 600 shown in FIG. 3 combines both a planar and trench MOS cells in a single design. However, both the planar channel 15 and trench channel 16 are separated. Similarly, in "Trench emitter IGBT with lateral and vertical MOS channels" (Proc. 23rd Internat. Conf. on Microelectronics MIEL 2002, 163-166) an IGBT is described, which comprises trench gate electrodes and planar gate electrodes in one device.

Zeng et al., Numerical Analysis of a Trench VDMOST Structure With No Quasi-Saturation (Solid State Electronics, V38, No 4, page 821-828, 1995) represents the first publication of Trench Planar MOS cell design. A similar design was published as a Spulber et al., A Novel Gate Geometry for the IGBT: The Trench Planar Insulated Gate Bipolar Transistor (TPIGBT) (IEEE Electron Device Letters, Vol 20, No. 11, November 1999, page 580). The Trench Planar IGBT 400 design shown in FIG. 4A consist only of a planar channel and proposes a trench structure to improve carrier accumulation. The concept proposed shallow trenches for improved blocking capability. In U.S. Pat. No. 9,093,522B2, a similar Trench Planar design 401 with an enhancement layer 17 described with an embodiment where the channel extends to include trench section 16 as shown in FIG. 4B. The channels are formed with a gaussian doping profile with the maximum doping region near the n-source p-base junction which defines the device MOS parameter. Hence, the trench channel will be very lightly doped and will have little impact on the device operation. In U.S. Pat. No. 8,441, 046B2, A Planar Trench MOS IGBT 500 with an enhancement layer was described as shown in FIG. 5. Similar to the Trench Planar NOS cell described above, the Planar Trench design includes a planar channel 15 and a trench channel 16 with the trench channel having higher doping levels compared to the Trench Planar design. U.S. Pat. No. 8,441, 046B2 also describes a Trench Shielded Planar version where the trench is grounded (not connected to the gate) and in one version cuts orthogonally through the planar cell.

The majority of the above patents describe an active trench connected to the gate in combination with a planar channel in a two-dimensional arrangement.

In U.S. Pat. No. 6,380,586B1 describes a trench IGBT 700 where planar channels 15 are orthogonally positioned in relation to the trench regions as shown in FIG. 6 for an embodiment having a discontinued trench at the emitter contact 3. A continuous trench cutting through the emitter contact 3 was also described. The main feature of this structure is the trench channel 16 which will provide electron injection in both lateral and vertical dimensions at the trench wall as shown in the cross-section B-B' as shown in FIG. 7. Such a device will have different MOS parameters such as the threshold voltage for the vertical and lateral channels. Furthermore, for the discontinued version, the trench MOS channel 16 at the trench periphery near 10' can become critical due to the sharp trench curvature in that region.

To overcome the above issues, U.S. Pat. No. 9,640,644 describes a planar cell structure 800 where the n-source regions 7 are separated from the trench by a highly doped p-region 8 which also extend along the trench orthogonal dimension for achieving higher turn-off capability as shown in FIG. 8. Hence, only a planar channel 15 is formed in this structure and no vertical channel along the trench oxide 12' is present as shown in FIG. 9 for the cross-section B-B'. However, this device will not provide lower conduction losses and the highly doped p-regions can result in high hole drainage levels.

The structures described above also suffer from complex and critical alignment process steps such as n-source 7 and p-region 8 structuring which can also increase the cost and limit the option to reduce the cell dimensions for providing lower losses.

It is desirable to find a new MOS cell design concept that can still benefit from the combination of the trench and planar MOS cell concepts while enabling simple process steps and lower conduction/on-state losses.

SUMMARY

A Planar Insulated Gate Bipolar Transistor IGBT with improved electrical characteristics is provided. Furthermore, a method for producing such a planar semiconductor device is also provided.

It is an object of the invention to provide a power semiconductor device with reduced on-state losses, low drainage of holes, stable gate parameters, improved blocking capability, and good controllability.

The power semiconductor device has layers of different conductivity types, which layers are arranged between an emitter electrode on an emitter side and a collector electrode on a collector side, which is arranged opposite of the emitter side. The layers comprise:

a drift layer of a first conductivity type, which is arranged between the emitter side and the collector side, separated in the second dimension a first base layer of a second conductivity type, which is arranged between the drift layer and the emitter electrode, which first base layer extends in the first dimension a source region of the first conductivity type, which is arranged at the emitter side embedded into the first base layer and contacts the emitter electrode, which source region has a higher doping concentration than the drift layer, and extends in the first dimension, and extends in the third dimension to the first gate electrode, a second base layer of the second conductivity type, which is arranged at the emitter side embedded into the first base layer and is situated deeper than the source region, and contacts the emitter electrode, which second base layer region has a higher doping concentration than the first base layer, a first gate electrode, which is arranged on top of the emitter side and the first gate electrode is electrically insulated from the first base layer, the source region and the drift layer by a first insulating layer, an lateral/horizontal channel is formable between the emitter electrode, the first source region, the first base layer and the drift layer when a positive voltage bias is applied to the first gate electrode a plurality of trenches embedding second gate electrodes, each of which is electrically insulated from the first base layer and the drift layer by a second insulating layer and which trenches are arranged with their length parallel to the third dimension (ie. orthogonally to the first direction in a top view plane), and are discontinued in the planar channel regions and extend deeper into the drift layer than the first base layer, a vertical channel is formable between the lateral/horizontal channel, the first base layer and the drift layer when a positive voltage bias is applied to the second gate electrodes.

The planar semiconductor device includes planar cells with a lateral or horizontal channel and a plurality of trenches, which are arranged orthogonally to the longitudinal extension direction of the planar cells and are discontinued in the planar channel regions to form lateral/horizontal planar channels in the mesa regions between the trenches, and form exceptionally a series connection between a lateral/horizontal planar channel and a vertical trench channel only in the discontinued trench regions.

The planar semiconductor device integrates a Trench into a Planar MOS cell in order to gain the advantages of both designs in terms of reduced on-state losses, low drainage of holes, stable gate parameters, improved blocking and good controllability.

The advantage of the planar gate design and trench design can be combined in the inventive semiconductor device while the disadvantages of the planar cell region and interspace between trench cells are eliminated.

Due to the fact that the area in between the orthogonal gate trenches does not need to be further structured, very high-density trenches can be used with trench mesa dimensions below 100 nm. This will significantly reduce the hole drainage effect as well known to those experts in the field.

In addition, for discontinued orthogonal gate trenches at the planar cell, the trench mesa dimension at the planar cell can be reduced to 1 μm for further reducing the hole drainage effect while keeping the planar cell dimensions larger than 1 μm.

The planar source region is formed to ensure stable gate parameters and blocking capability. However, the trenches will provide a vertical channel with improved vertical spreading.

Some or all of the plurality of second gate electrodes can be directly connected to the first gate electrodes, or can be grounded to the emitter electrode, or made floating. If the second gate electrodes gates are shorted to the emitter electrode, there is no voltage differential between the second gate electrodes and effectively no capacitance. Since the second gates do not invert the first base region, the cell containing the second gate is a passive type of cell, as opposed to an active cell controlled by the gate trenches. By controlling the number of passive cells, the input capacitance of the device can be precisely controlled.

Similarly, if the second gate electrodes are floating, resulting in a passive cell, the potential floats up to the emitter voltage so there is effectively no capacitance associated with the second gates.

Furthermore, the device is easy to manufacture, because the inventive design can be manufactured based on a self-aligned process with minimum a number of masks required.

The new design offers a wide range of advantages both in terms of performance (reduced losses, improved controllability and reliability), and processability (very narrow mesa design rules, reliable planar process compatibility) with the potential of applying enhanced layer structures. The inventive design is suitable for full or part stripes but can also be implemented in cellular designs.

The design is also suitable for reverse conducting structure and can be applied to both IGBTs and MOSFETs based on silicon or wide bandgap materials such as Silicon Carbide SiC.

The method for manufacturing a power semiconductor device comprises the following steps:
a trench region is produced by etching on the first main side of the substrate of a first conductivity type
a first oxide layer is produced on a first main side of a substrate of a first conductivity type,
a structured gate electrode layer with at least one opening is produced on the first main side on top of the first oxide layer,
first dopants of a second conductivity type are implanted into the substrate on the first main side and,
the first dopants are diffused into the substrate, characterized in that,
the structured gate electrode layer is used as a mask for implanting the first dopants,
second dopants of a first conductivity type are implanted into the substrate on the first main and,
the second dopants are diffused into the substrate, characterized in that,
the second dopants are diffused to a lower depth than the first dopants,
the structured gate electrode layer or an additional mask is used as a mask for implanting the second dopants,
third dopants of a second conductivity type are implanted into the substrate on the first main side and,
the third dopants are diffused into the substrate, characterized in that,
the third dopants are implanted and diffused to a lower depth than the first dopants,
the structured gate electrode layer or an additional mask is used as a mask for implanting the third dopants,
an insulating oxide layer is produced on the first main side,
a contact opening is produced by etching through the insulating layer and by filling a resulting contact opening with metal The method for manufacturing a power semiconductor device, in particular an IGBT or MOSFET, has the advantage that the base and source layers are self-aligned by using the structured gate electrode layer as a mask.

BRIEF DESCRIPTION OF THE DRAWINGS

The invention will be explained in more detail in the following text with reference to the attached drawings, in which.

DETAILED DESCRIPTION

It should be noted that the drawings are only schematic and not to scale. Generally, alike or alike-functioning parts are given the same reference symbols. The described embodiments are meant as examples and shall not confine the invention.

Figure 1A:
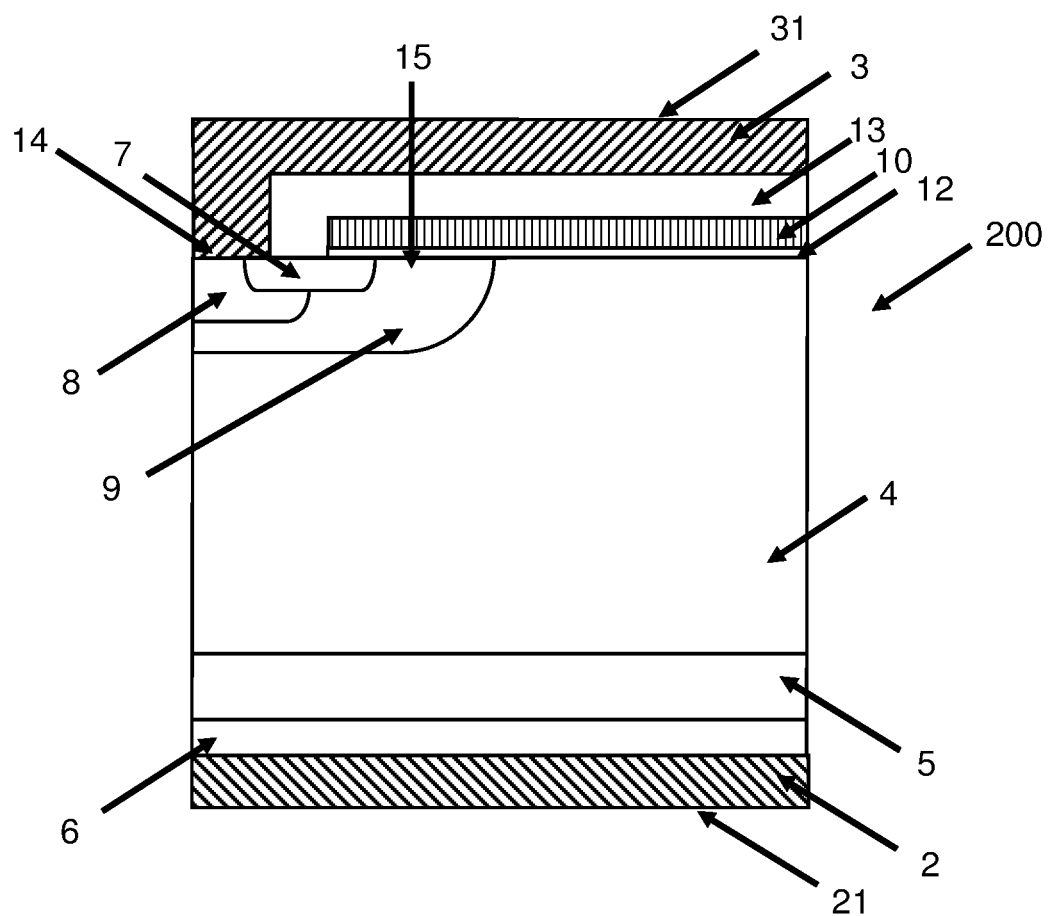
FIGS. 1A-B: show the cross sections of Planar MOS IGBT structures (prior art).
Figure 1B:
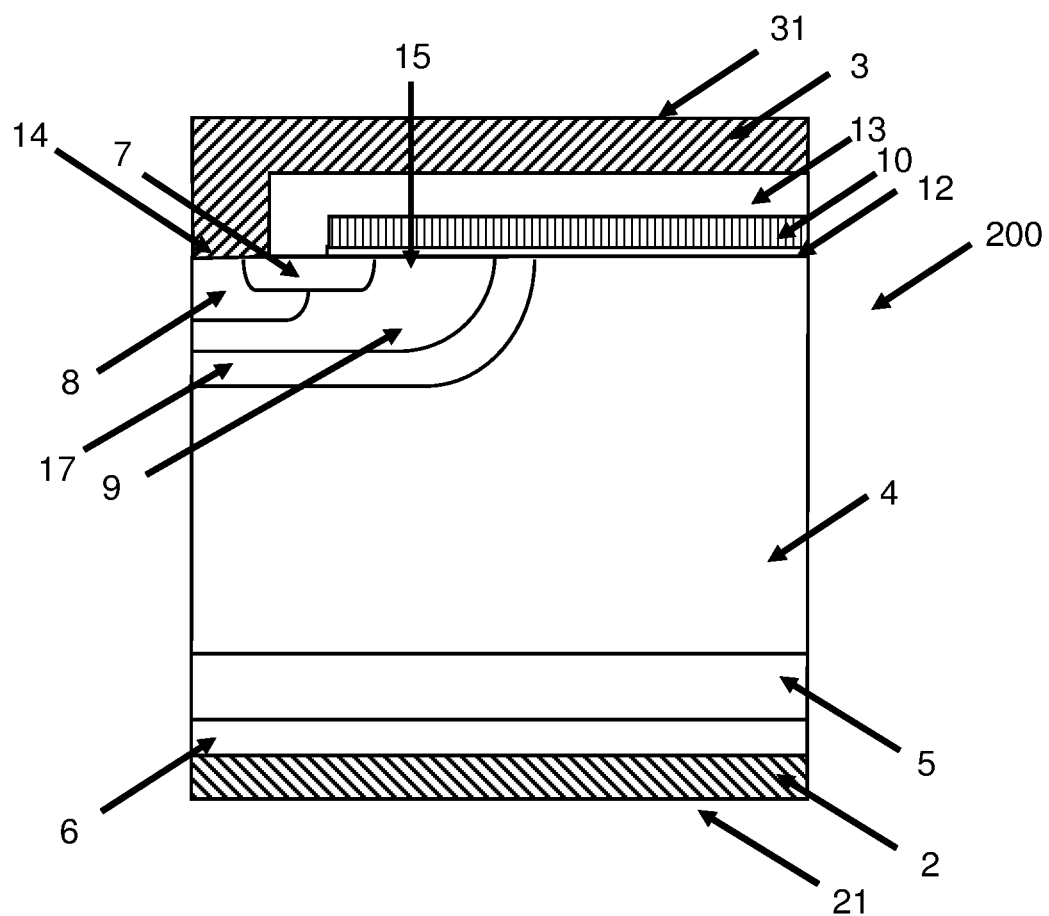
Figure 2A:
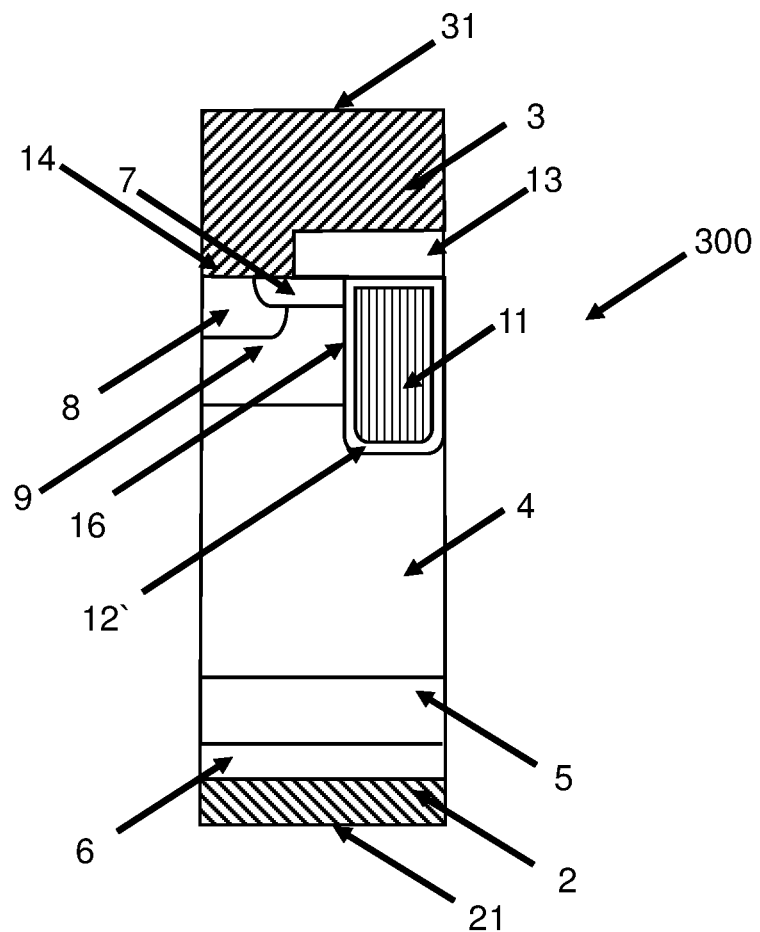
FIGS. 2A-B: show the cross sections of Trench MOS IGBT structures (prior art).
Figure 2B:
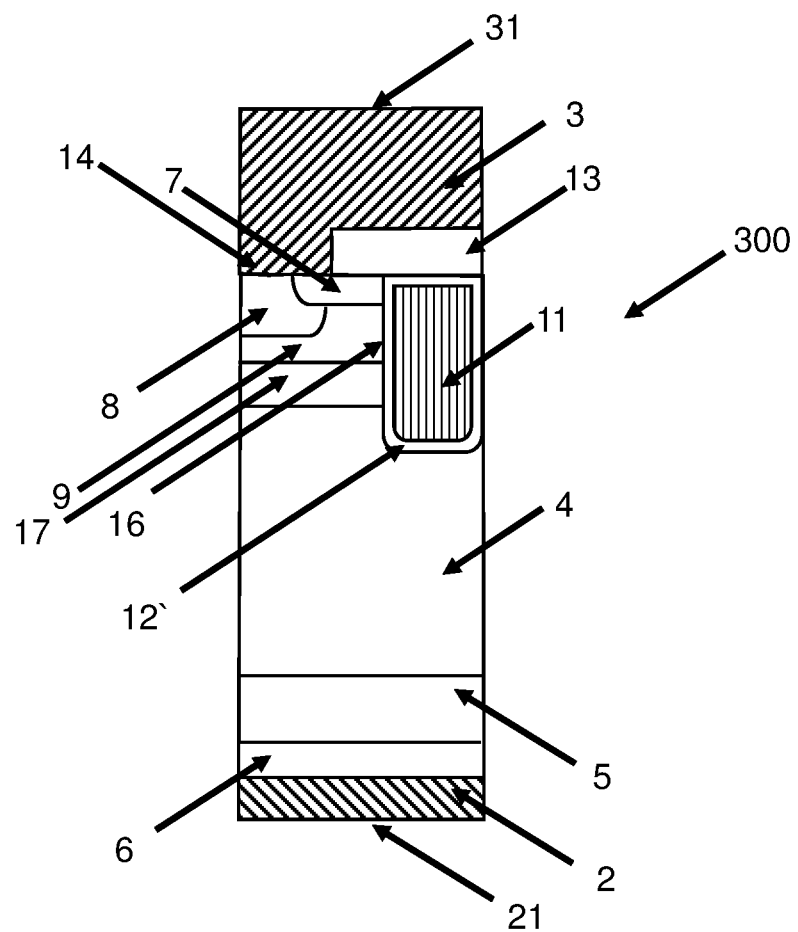
Figure 3:
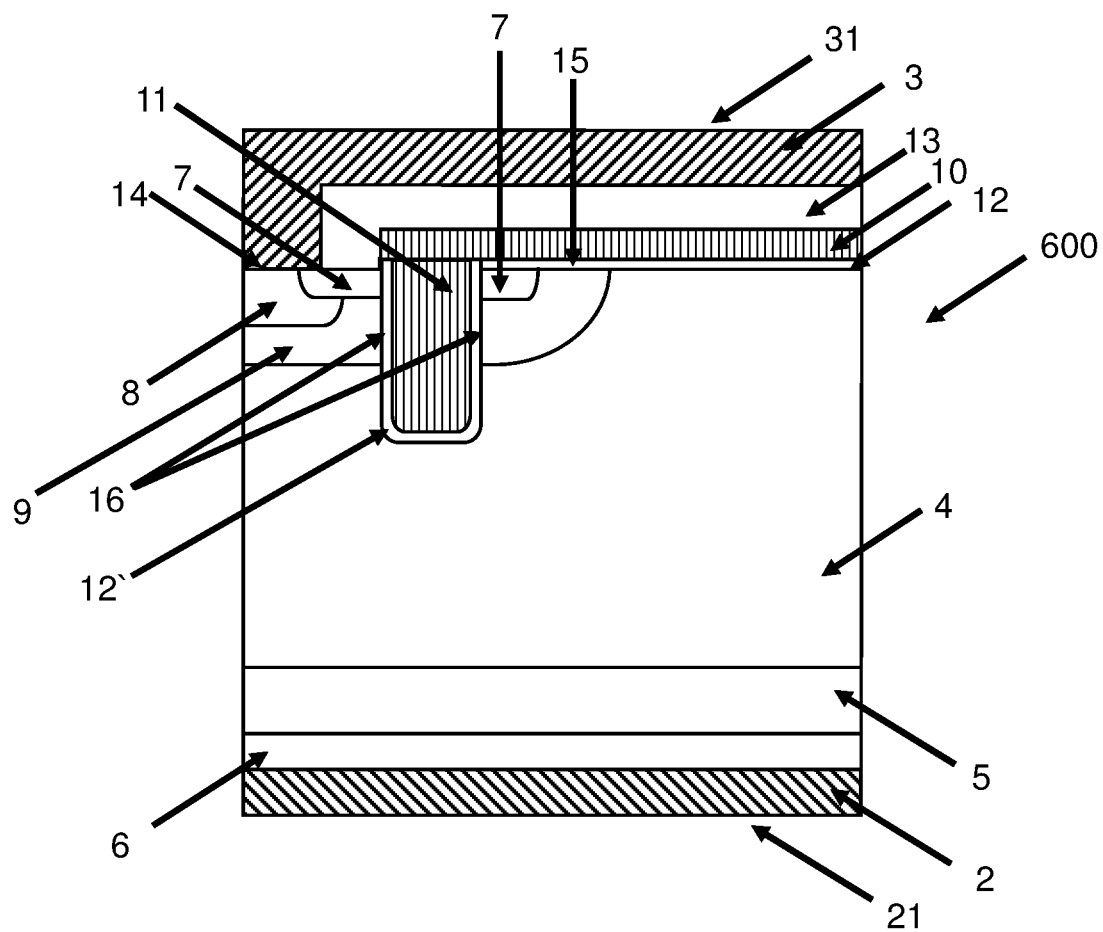
FIG. 3: show the cross section of Trench Planar MOS IGBT structure (prior art).
Figure 4A:
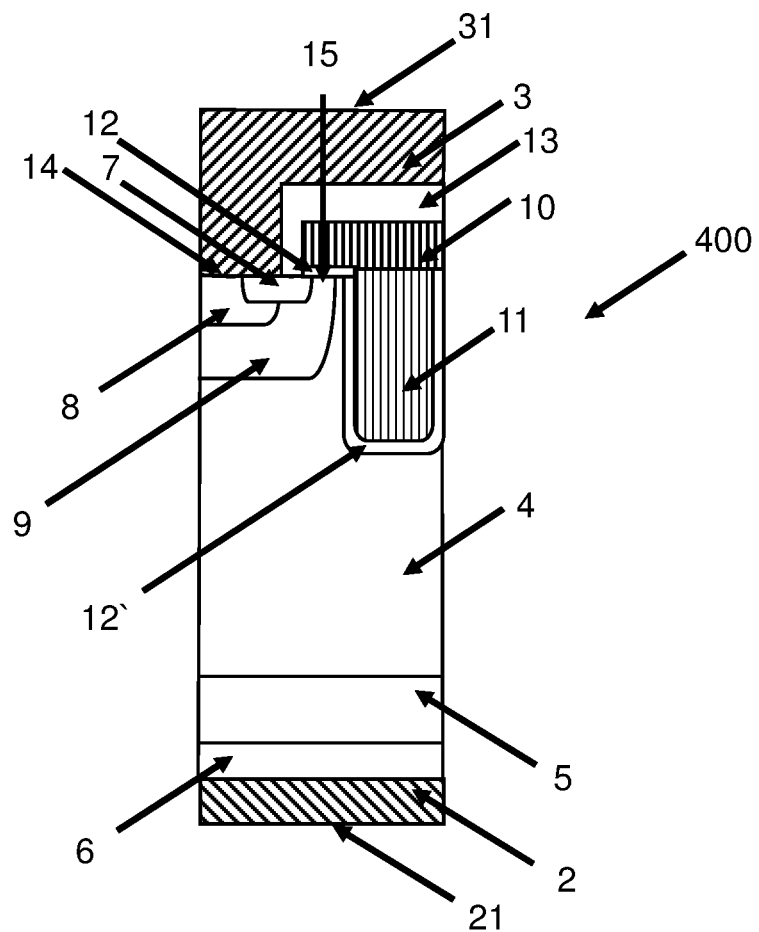
FIGS. 4A-B: show an alternative cross-section of Trench Planar MOS IGBT structures (prior art).
Figure 4B:
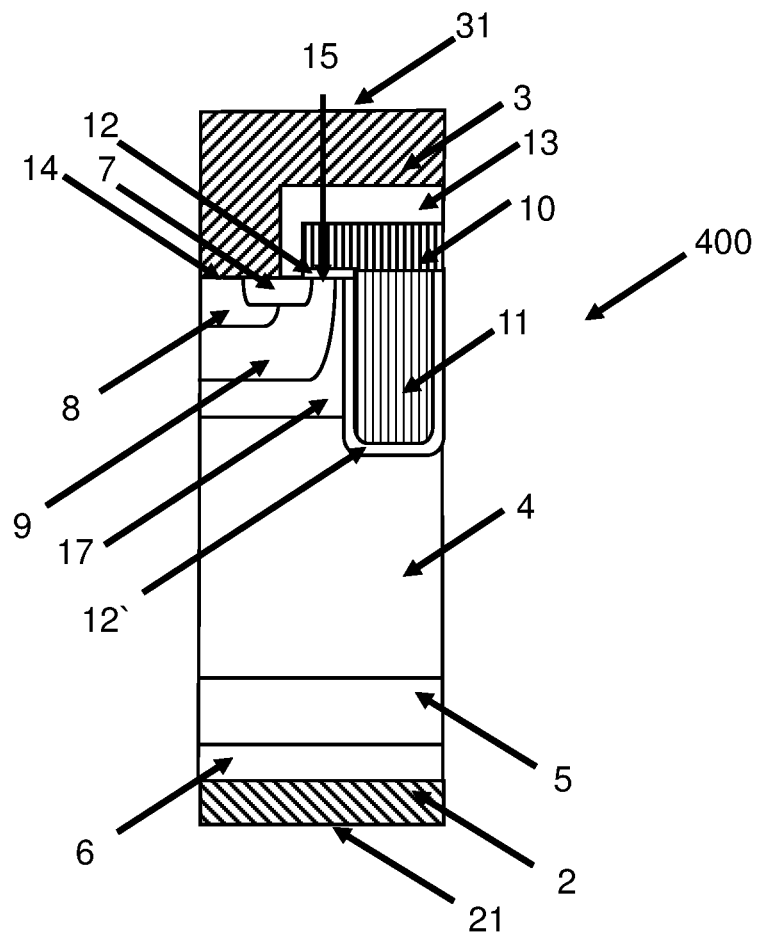
Figure 5A:
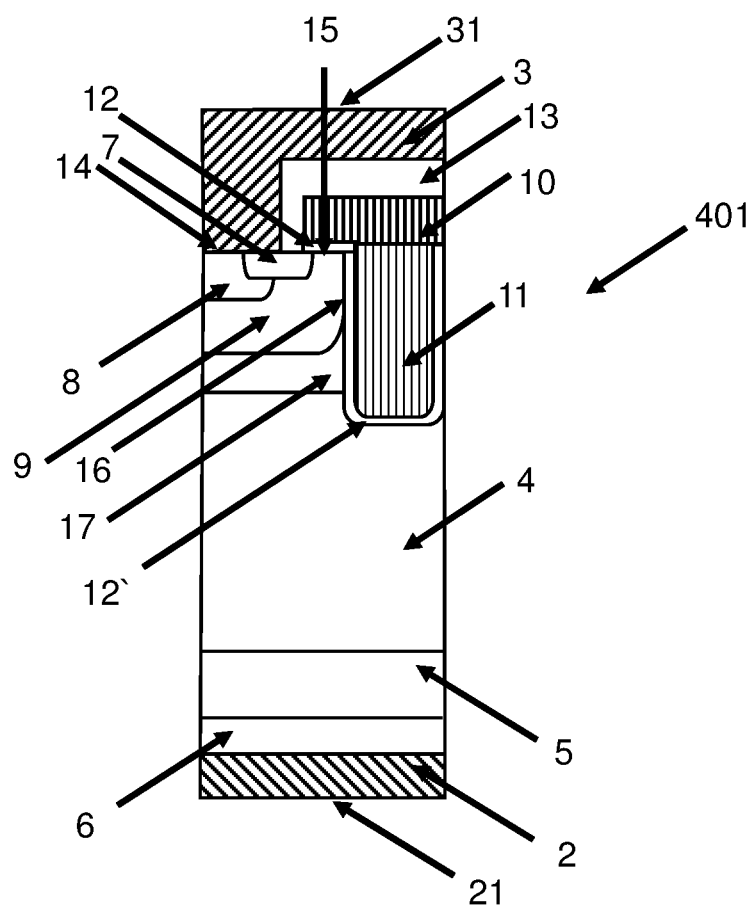
FIG. 5A-B: show the cross sections of Planar Trench MOS IGBT structures (prior art).
Figure 5B:
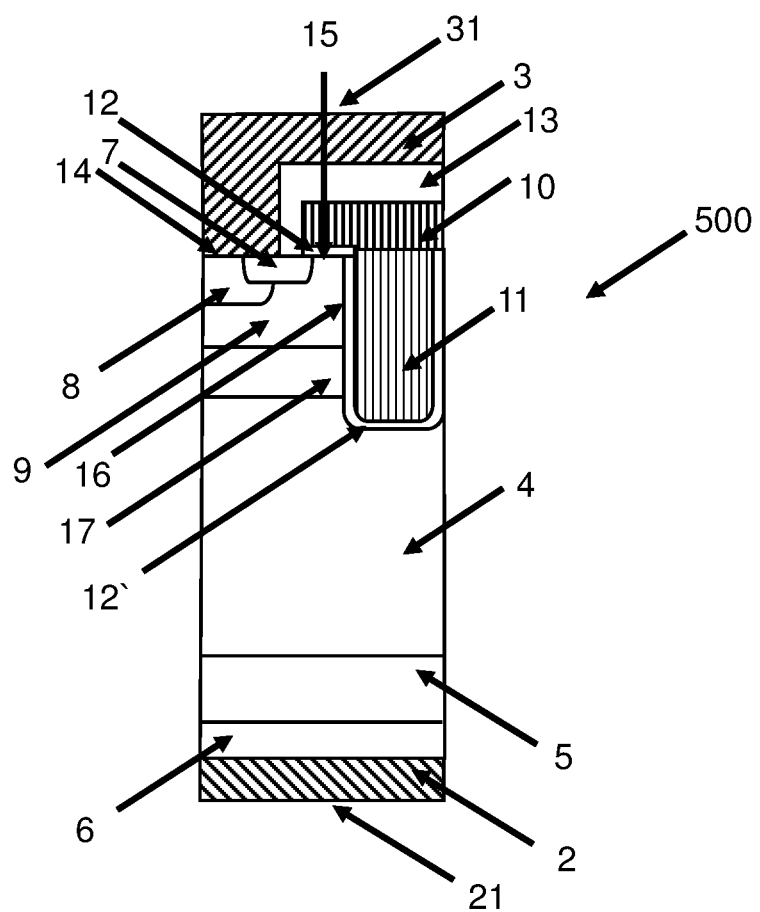
Figure 6:
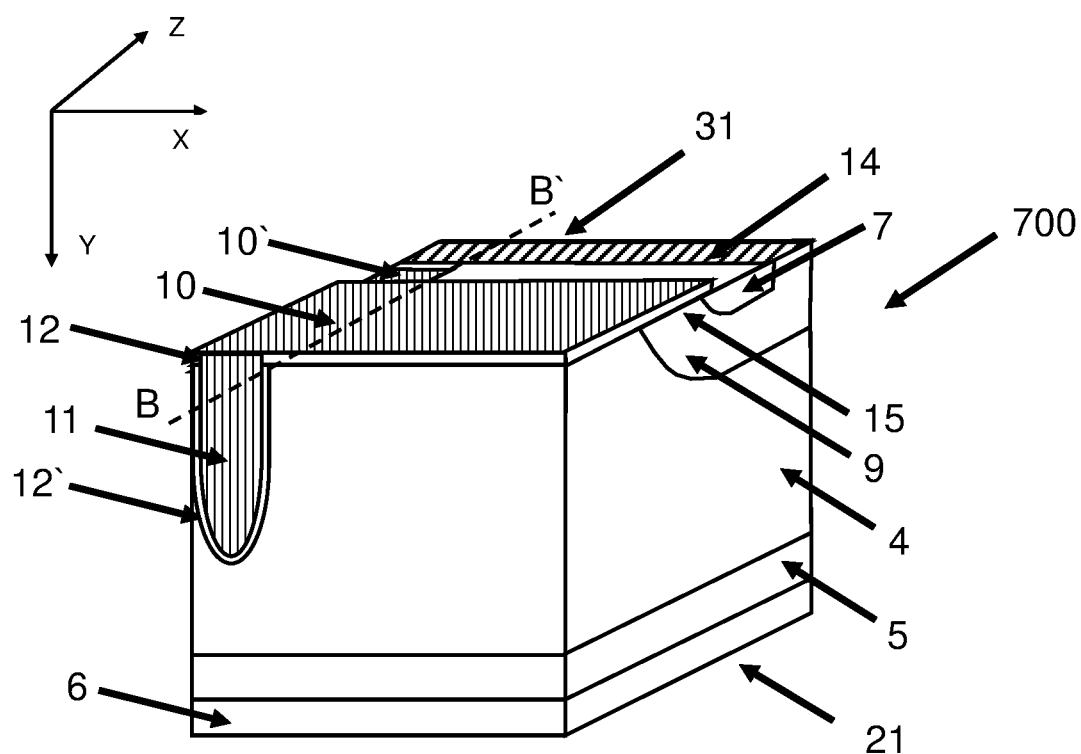
FIG. 6: show the Trench Planar MOS IGBT structure (prior art).
Figure 7:
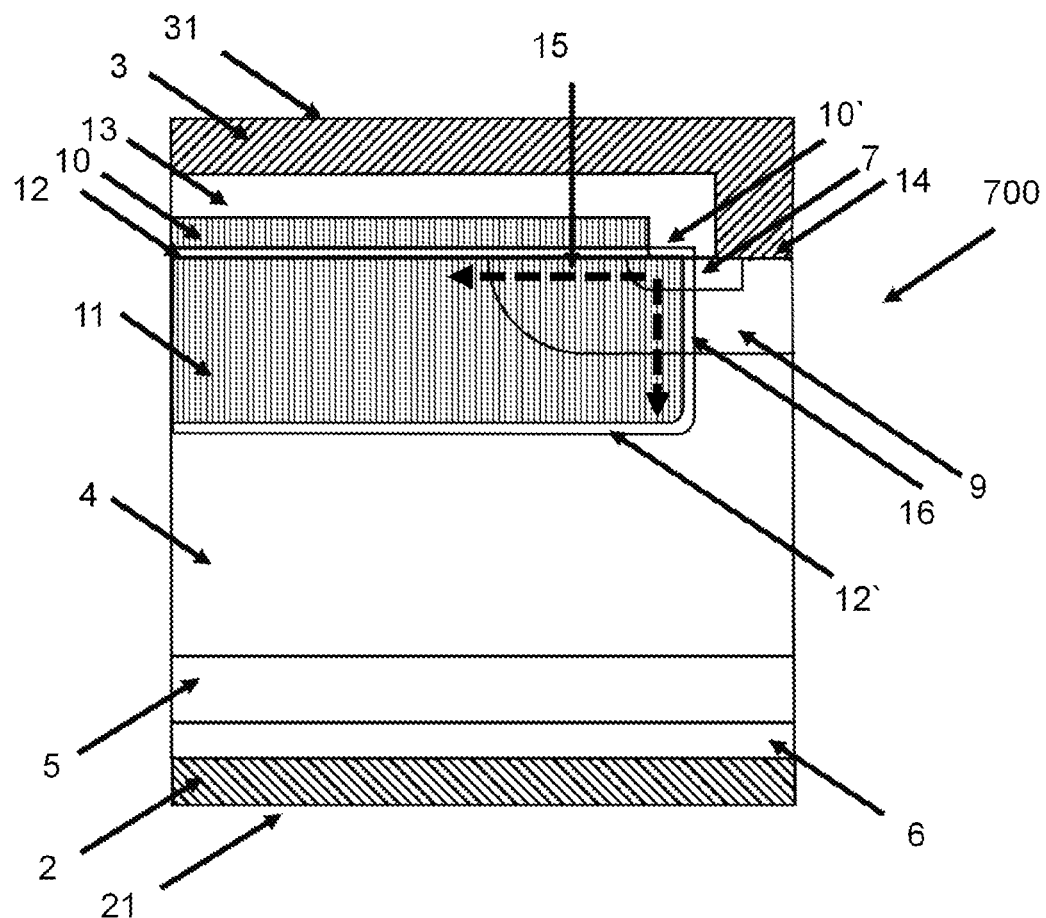
FIG. 7: show the cross sections of Trench Planar MOS IGBT structure at cut B (prior art).
Figure 8:
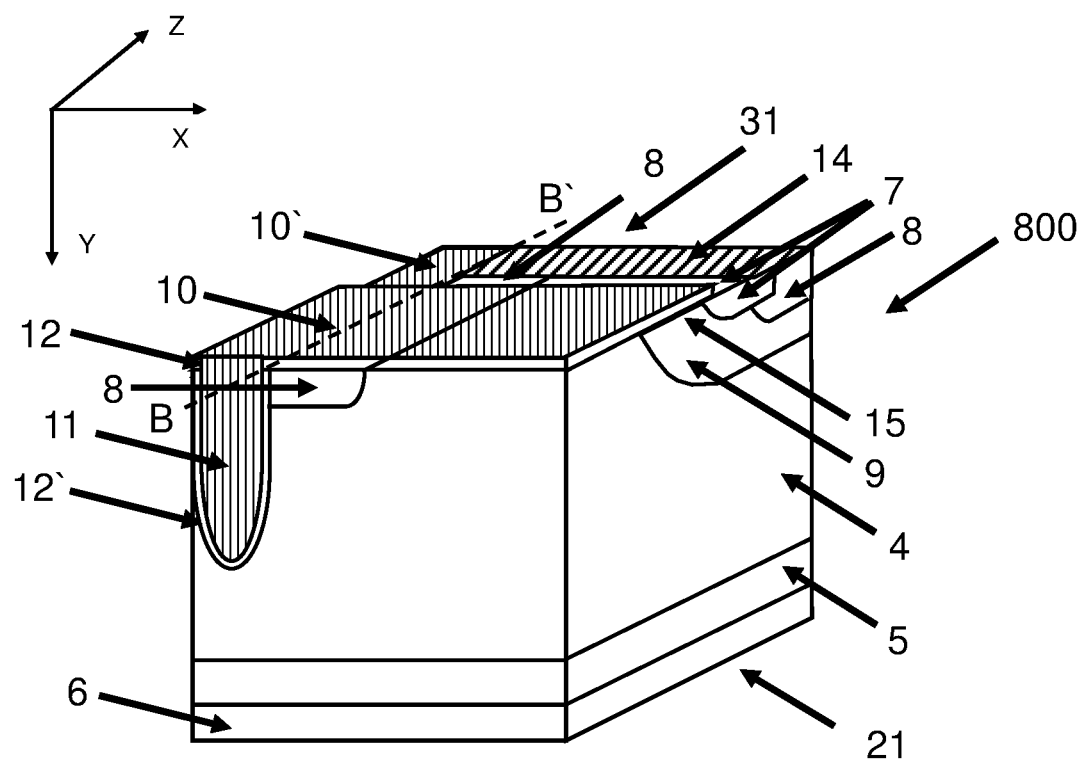
FIG. 8: show the Trench MOS IGBT structure (prior art).
Figure 9:
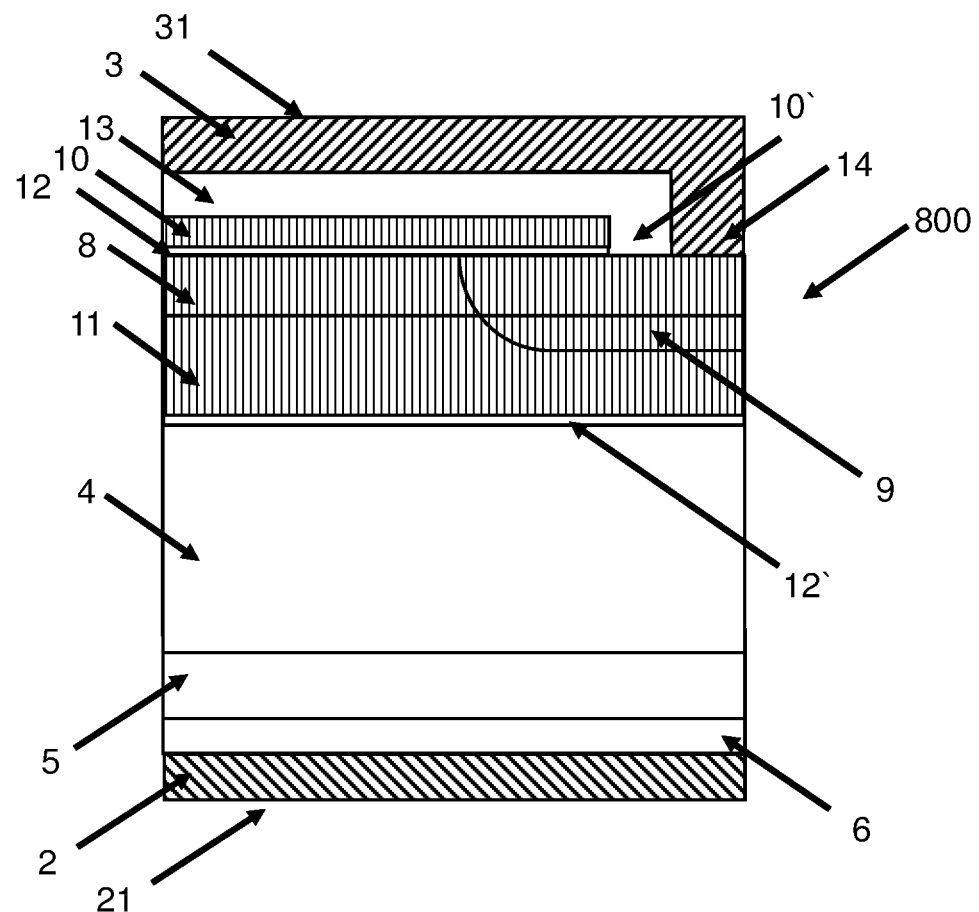
FIG. 9: show the cross sections of Trench MOS IGBT structure at cut B (prior art).
Figure 10:
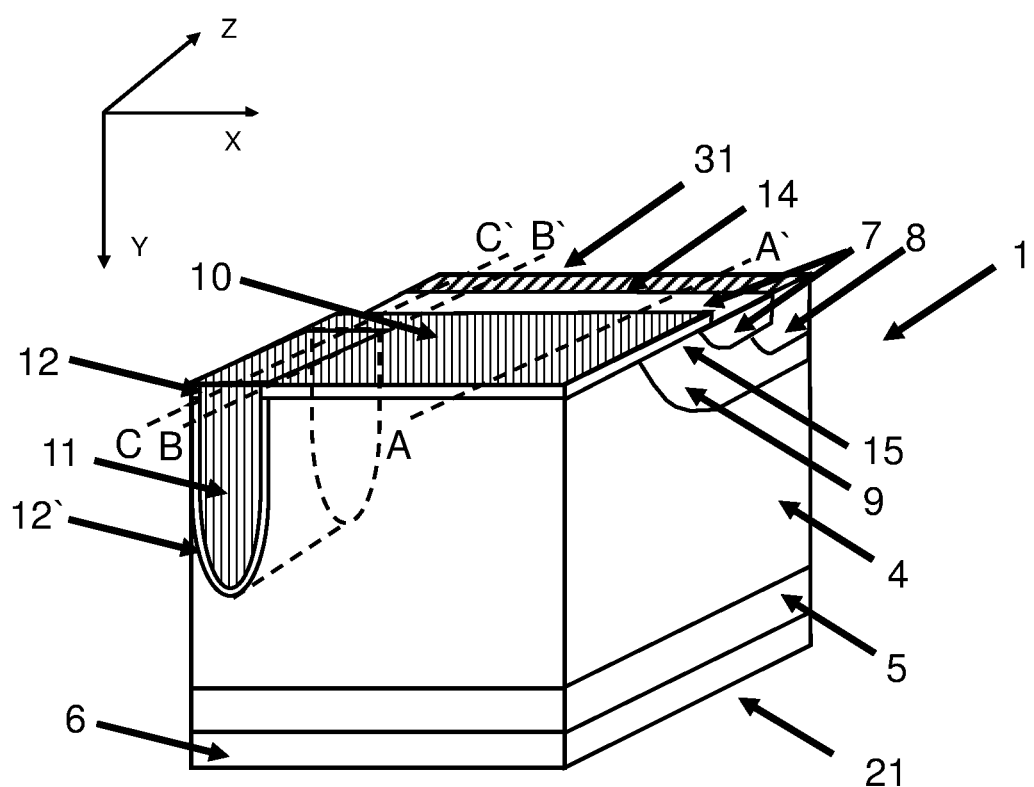
FIG. 10: show a first exemplary embodiment of a power semiconductor device according to the invention.

FIG. 10 shows a first exemplary embodiment of a power semiconductor device 1 in form of a punch through insulated gate bipolar transistor (IGBT) with a four-layer structure (pnpn). The layers are arranged between an emitter electrode 3 on an emitter side 31 and a collector electrode 2 on a collector side 21, which is arranged opposite of the emitter side 31. The IGBT comprises the following layers:
- an (n-) doped drift layer 4, which is arranged between the emitter side 31 and the collector side 21, extending in a second dimension Y
- a p doped first base layer 9, which is arranged between the drift layer 4 and the emitter electrode 3, extending in a first direction X,
- a p doped second base layer 8, which is arranged between the first base layer 9 and the emitter electrode 3, which second base layer 8 is in direct electrical contact to the emitter electrode 3, which second base layer 8 has a higher doping concentration than the first base layer 9, which second base layer 8 extends perpendicularly deeper than the source region while allowing the horizontal channels to form,
- an n doped source region 7, which is arranged at the emitter side 31 embedded into the first base layer 9 and contacts the emitter electrode 3, which source region 7 has a higher doping concentration than the drift layer 4, and extends in a first direction X
- a first gate electrode 10, which is arranged on top of the emitter side 31 and the first gate electrode 10 is electrically insulated from the first base layer 9, the source region 7 and the drift layer 4 by a first insulating layer 12, an lateral/horizontal channel 15 is formable between the emitter electrode 31, the source region 7, the first base layer 9 and the drift layer 4,
- a plurality of trenches embedding second gate electrodes 11, each of which is electrically insulated from the first base layer 9, and the drift layer 4 by a second insulating layer 12' and which trenches are arranged with their length parallel to the third dimension Z (ie. orthogonally to the top view extension direction of the first base layer 9), and is discontinued in the planar channel regions 15 and extends deeper into the drift layer 4 than the first base layer 9, a vertical channel is formable between the lateral/horizontal channel, the first base layer 9 and the drift layer 4,
- a collector layer 6 arranged between the buffer layer 5 and the collector electrode 2, which collector layer 6 is in direct electrical contact to the collector electrode 2, and
- a buffer layer 5 arranged between the collector layer 6 and the drift region 4.

Figure 11:
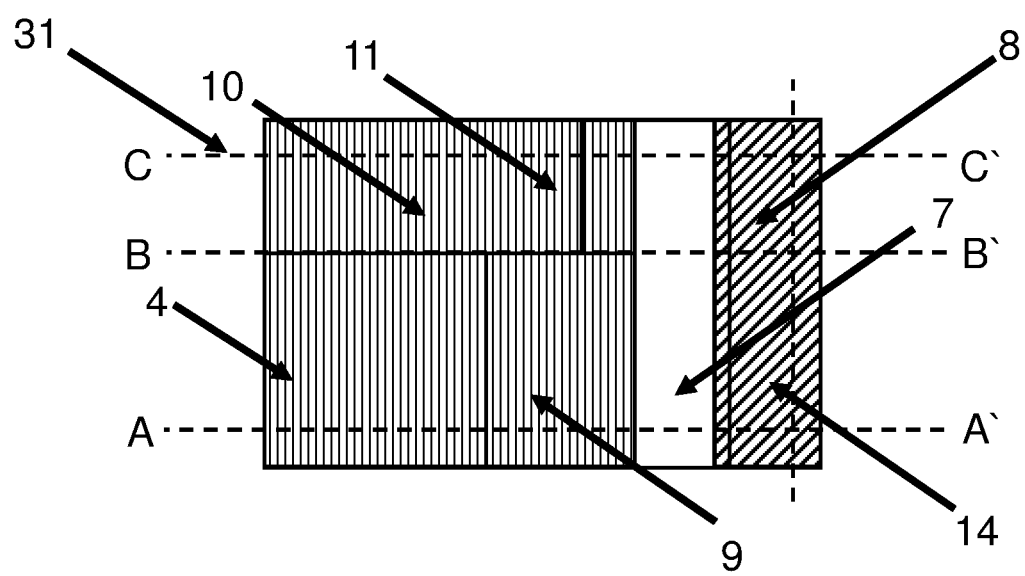
FIG. 11: Top view of first exemplary embodiment of a punch-through IGBT according to the invention.
Figure 12:
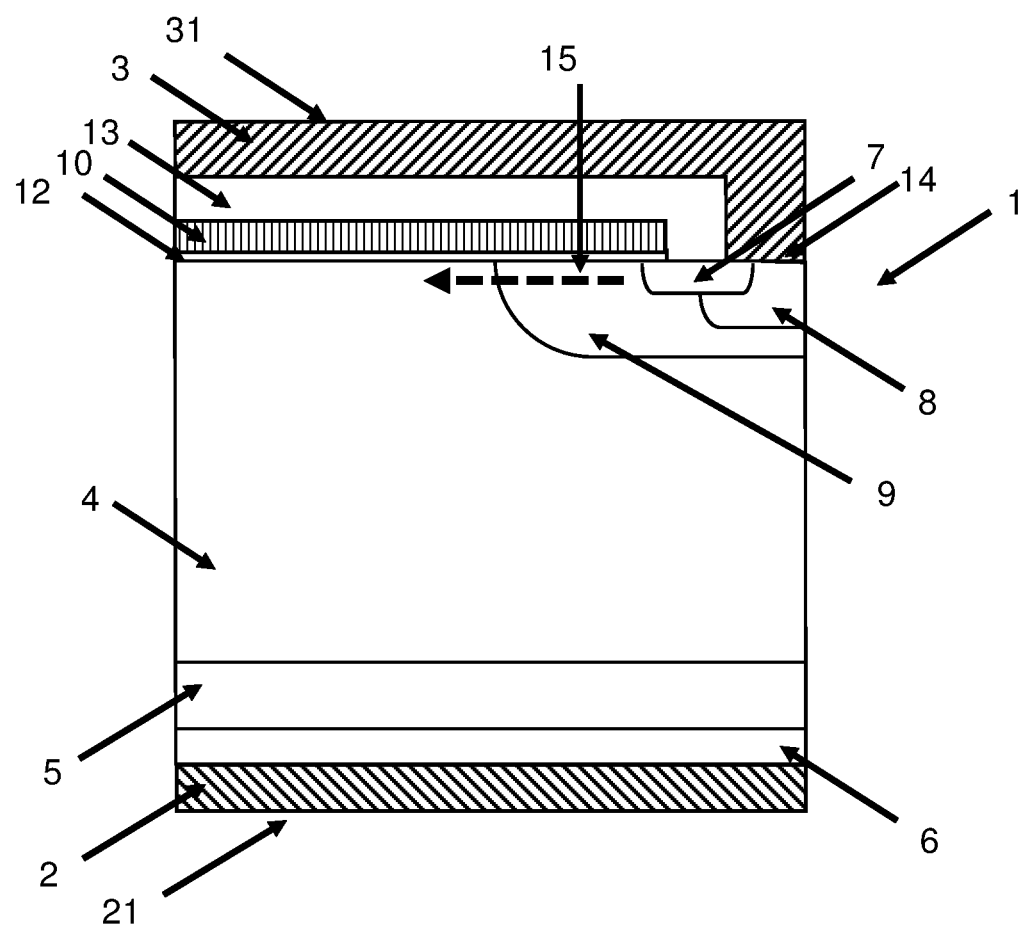
FIG. 12: Cross section along A-A' of first exemplary embodiment of a punch-through IGBT according to the invention.
Figure 13:
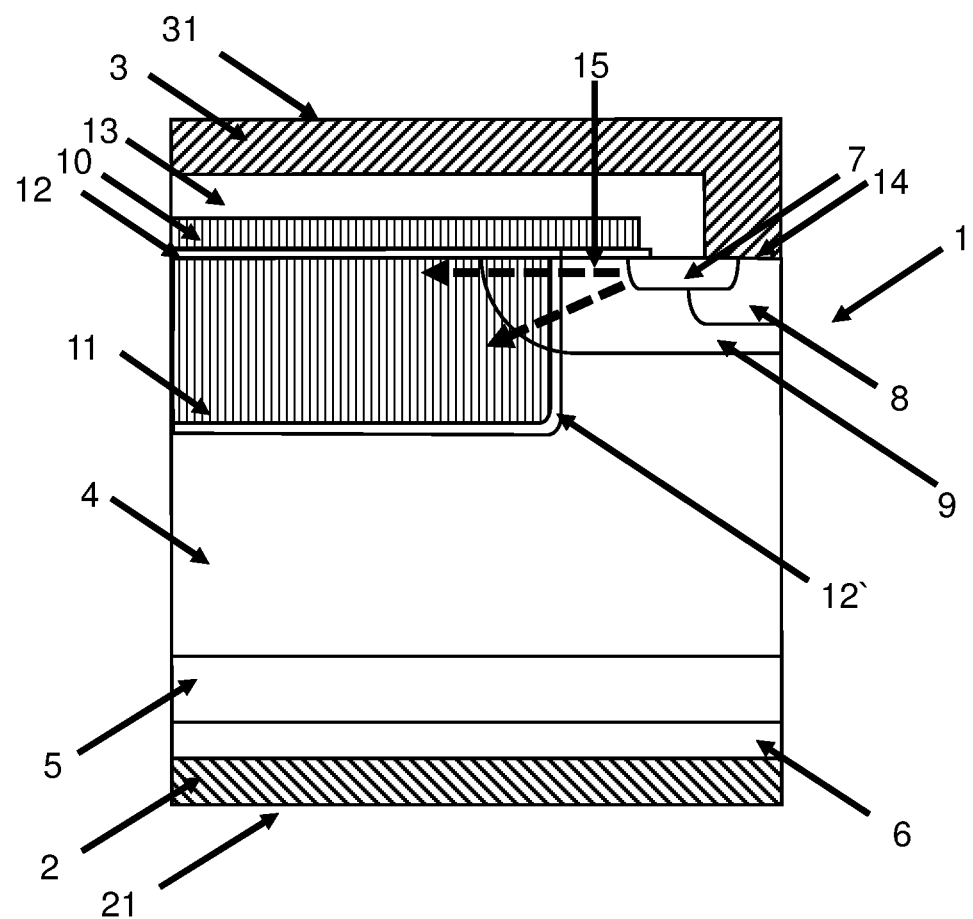
FIG. 13: Cross section along B-B' of first exemplary embodiment of a punch-through IGBT according to the invention.
Figure 14:
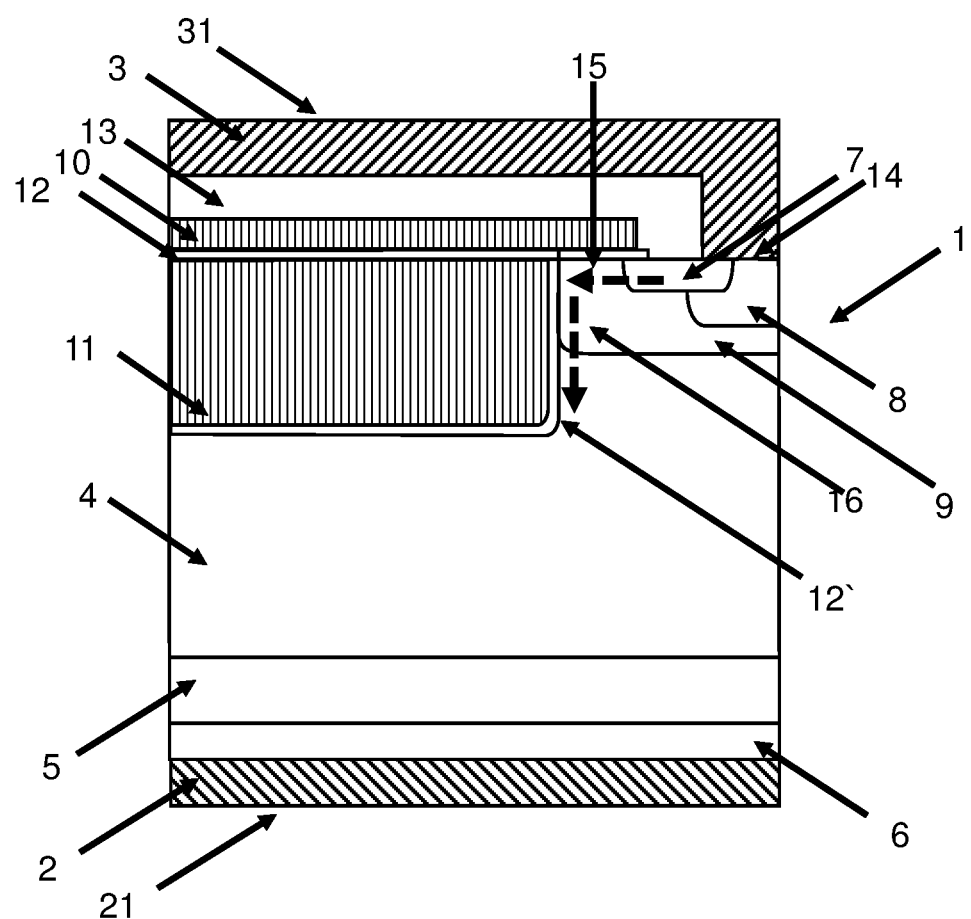
FIG. 14: Cross section along C-C' of first exemplary embodiment of a punch-through IGBT according to the invention showing series connected planar and trench channels.

The trench regions can be better viewed in the top cell view shown in FIG. 11 for the first main embodiment of the inventive design. The inventive design consists of a basic planar MOS cell design with active trenches 11 (connected to gate electrode 10) occupying the regions between the planar cells in the 3rd dimension, or in other words, orthogonal to the extension direction of the planar cells in the first dimension. FIG. 12 to FIG. 14 show the cross sections of the inventive design along the cut lines shown in FIG. 11. The inventive design provides a lateral/horizontal channel 15 in the planar regions 10 (A-A') and a lateral/horizontal channel 15 with improved vertical spreading at the edge of the trench region 11 (B-B'), and exceptionally, a series connection between a planar lateral/horizontal channel and a vertical channel in the trench region 11 (C-C').

Specifically, the trenches extend in a second dimension to a depth approximately in a range from about 2 μm to about 7 μm from the top side. The trench width may range from about 3 μm to about 0.5 μm.

Figure 15A:
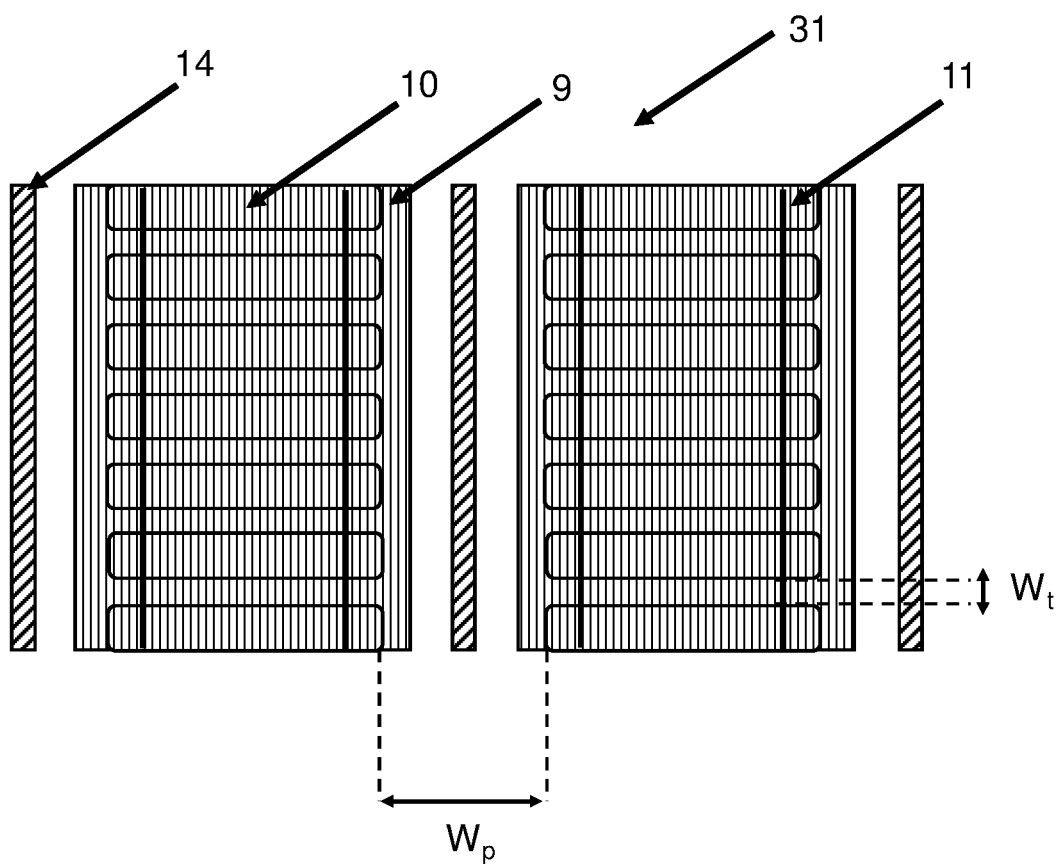
FIG. 15A: A typical top view for a stripe design of first exemplary embodiment of a punch-through IGBT according to the invention where all trenches have the same length
Figure 15B:
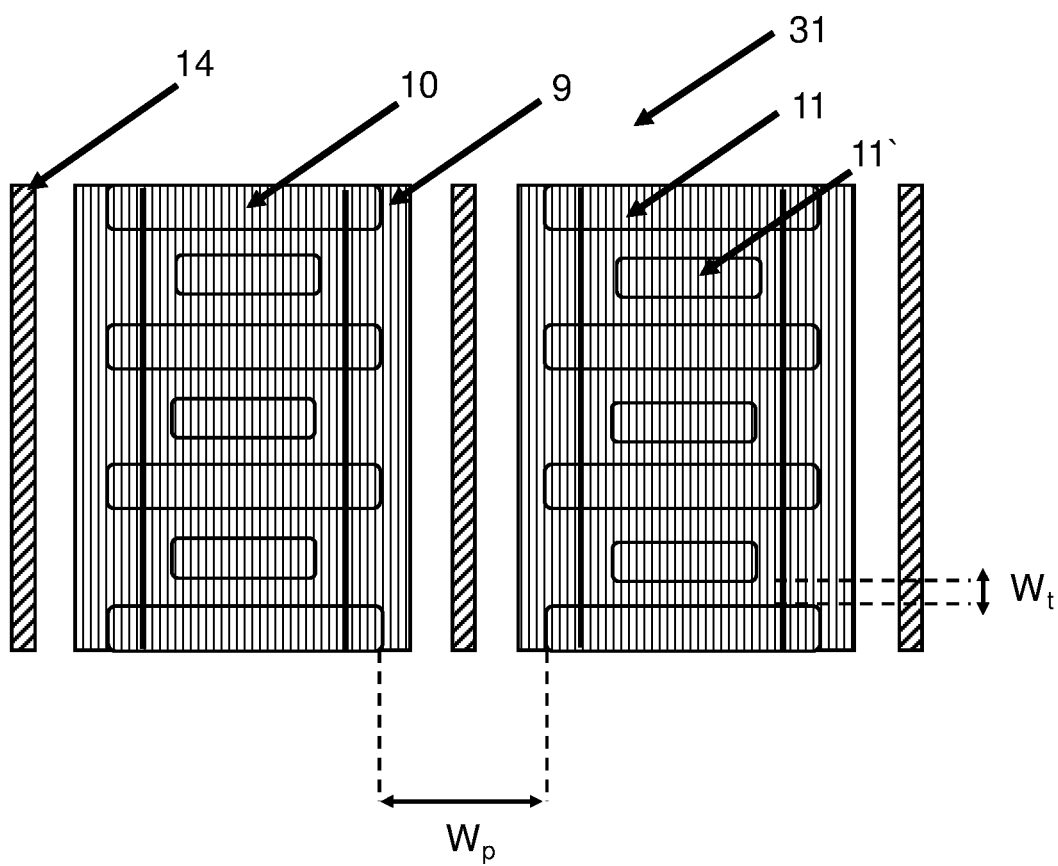
FIG. 15B: A typical top view for a stripe design of first exemplary embodiment of a punch-through IGBT according to the invention where some of the trenches have different lengths

With respect to the top views shown in FIG. 15A-B, the critical design aspects are the dimension $W_t$ or mesa between the orthogonal trenches in the first direction, as well as the dimension $W_p$ representing the distance from the end of one trench to the adjacent trench in the third dimension. Improved carrier storage/reduced hole drainage is expected as the dimensions $W_t$ and $W_p$ are reduced. The value of $W_t$ may be in a range from about 5 μm to below 0.1 μm, more preferably from 1 μm to 0.1 μm—which is achievable with the proposed design because no additional structures have to be lithographically defined in between the trenches, as in prior art. Also, improved carrier storage/reduced hole drainage is expected with reducing the planar cell dimensions, or by keeping the same pitch for the planar cell part, but reducing the distance $W_p$ by etching the adjacent trenches closer to each other. More specifically, $W_p$ could extend approximately in a range from about 20 μm to about 1 μm, preferably from 5 μm to 1 μm, and more preferably from 2 μm to 1 μm. The length of the orthogonal trenches can very on the same structure as shown in FIG. 15B where the trenches with a shorter length 11' can be discontinued in the drift region 4, and the trenches with longer length 11 can be discontinued in the first base layer 9. Other orthogonal trench design parameters can also vary on the same structure such as the width, depth or voltage bias. For example, some trenches could be etched at a larger depth than adjacent ones, or with a different width.

The inventive method for manufacturing a planar MOS cell on an emitter side is shown in cross sections in the FIGS. 16 to 24 and corresponding top views in the FIGS. 25 to 31. The method comprises manufacturing steps as follows.

Figure 16:
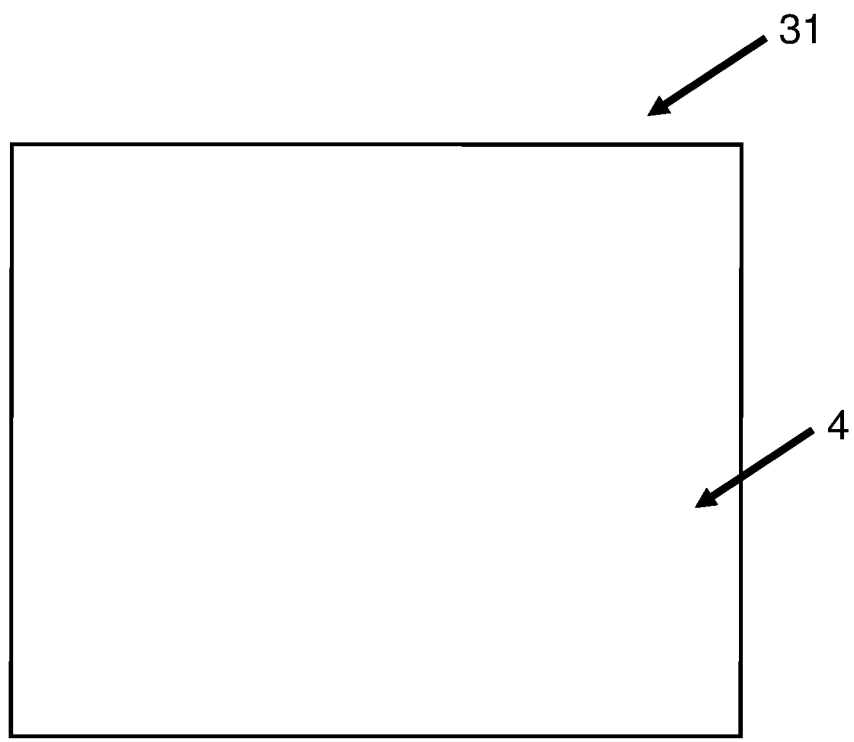
FIGS. 16-24: show a cross section of the different steps of the method for manufacturing a semiconductor device according to the invention.
Figure 17:
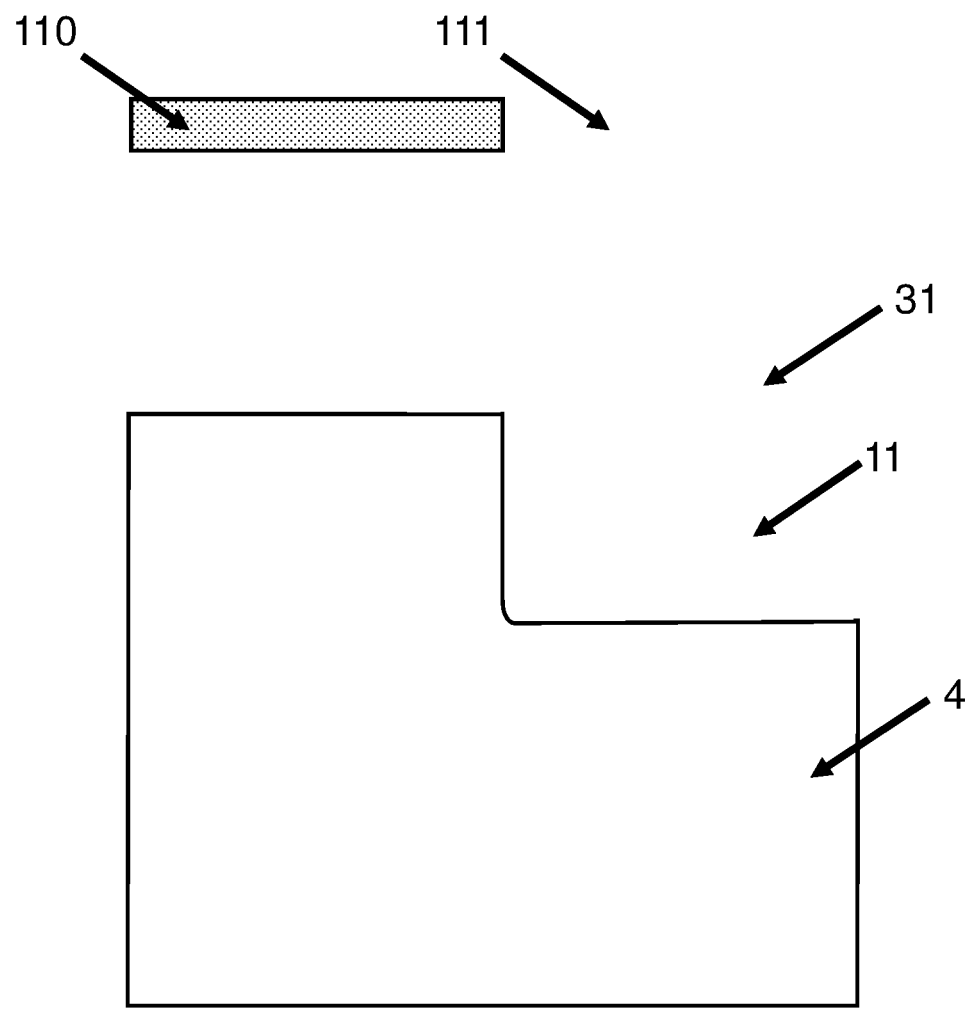
Figure 18:
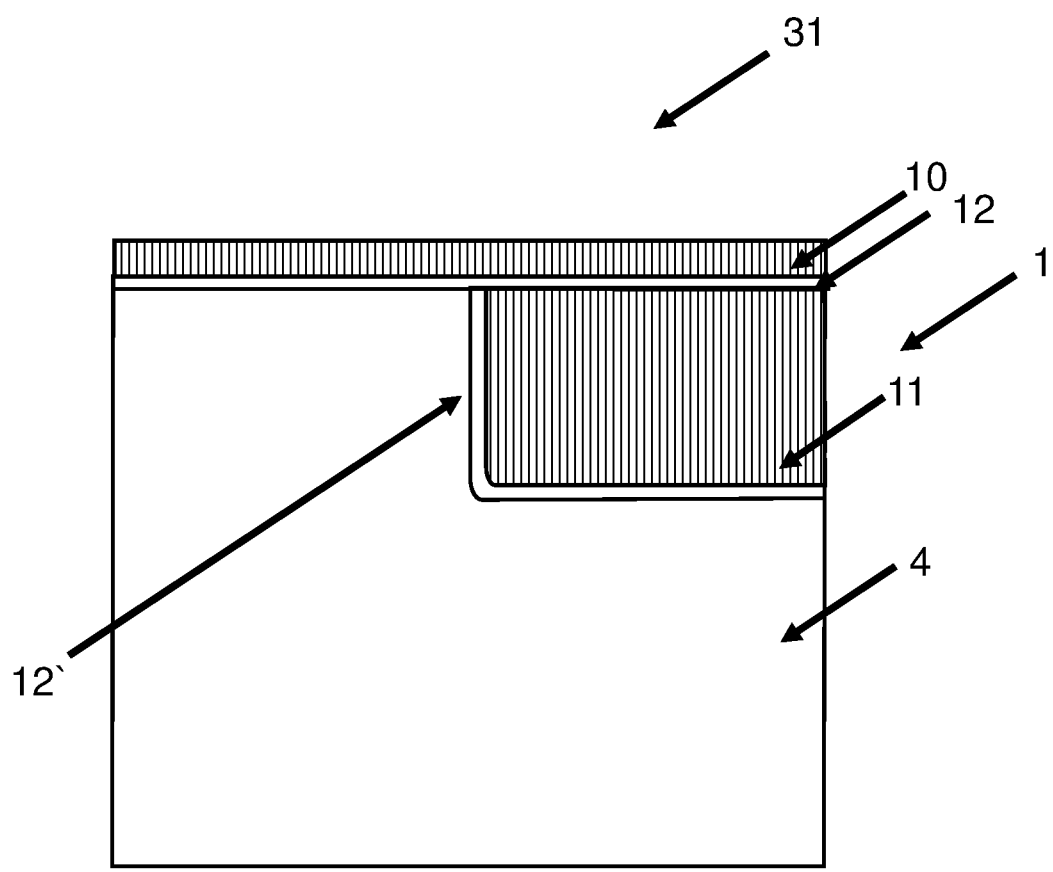
Figure 19:
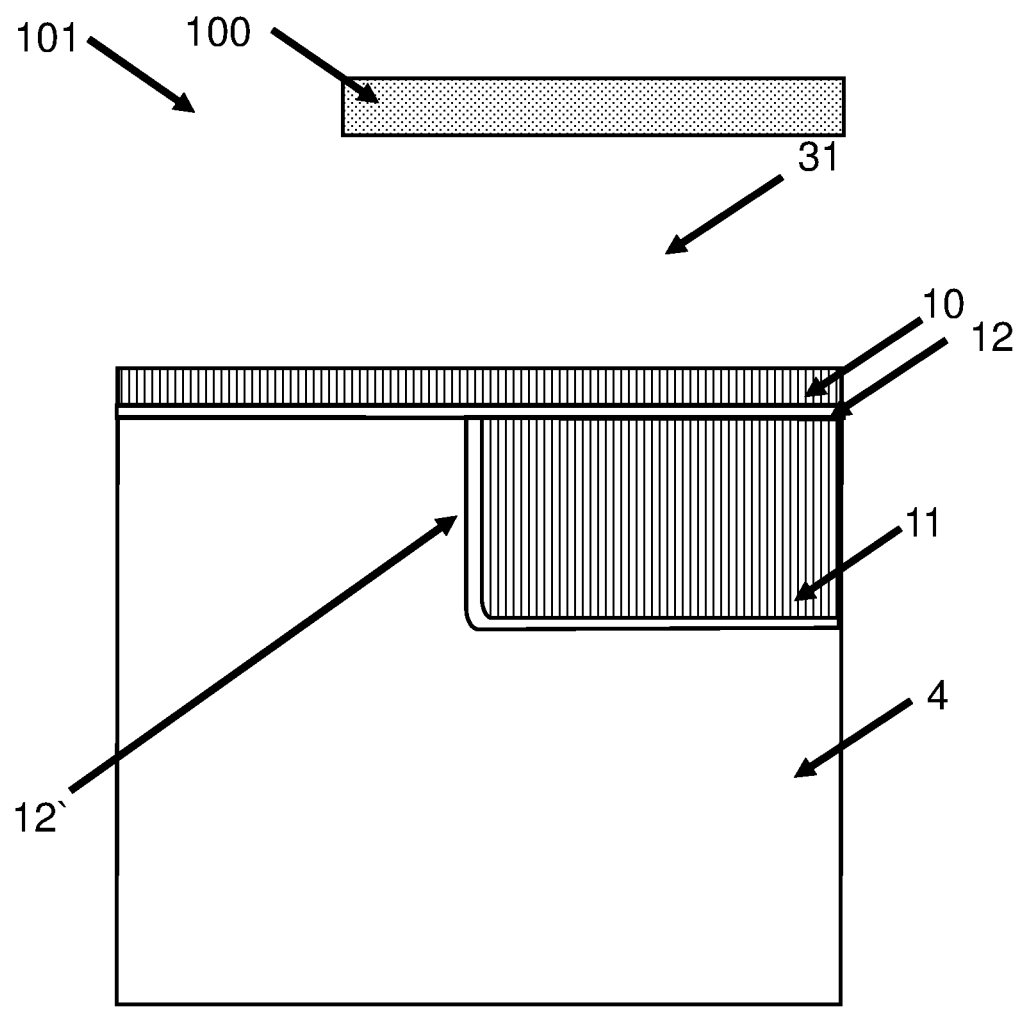
Figure 20:
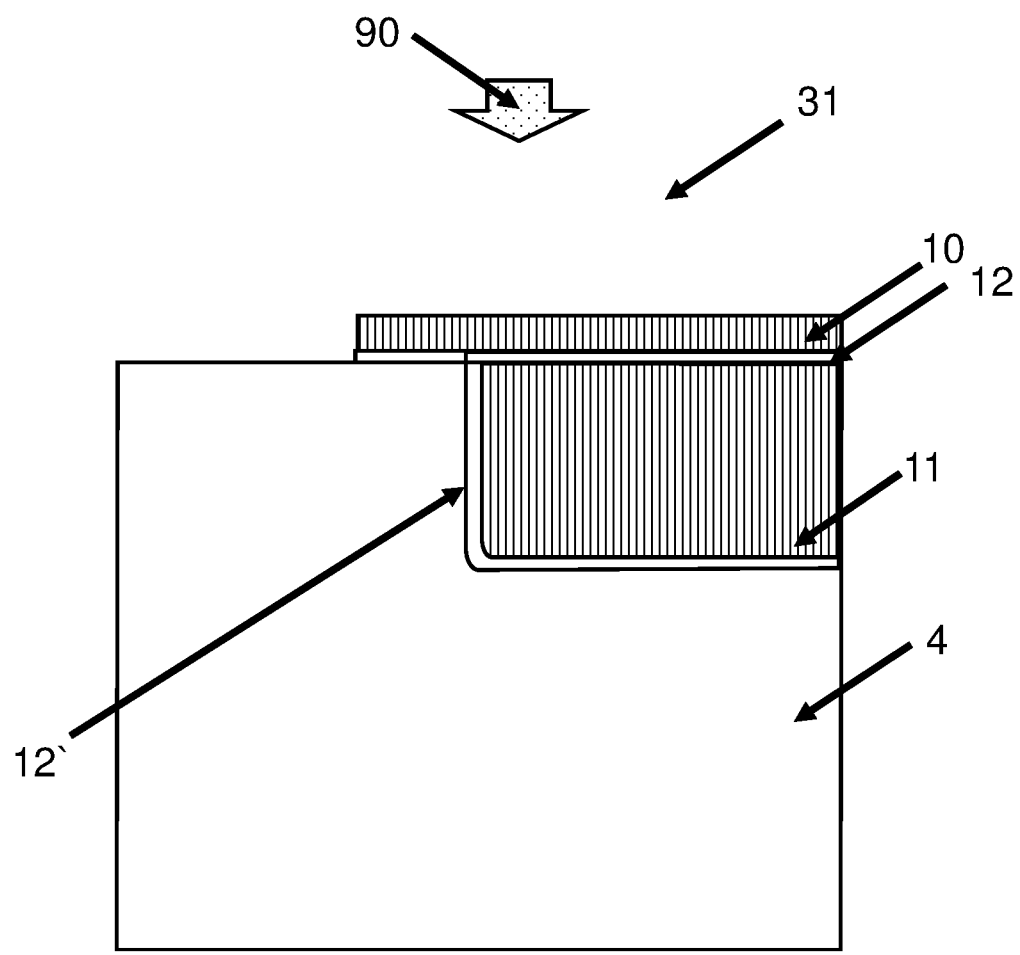

As shown in FIG. 16 (corresponding top view FIG. 25) the method is started with a lightly n doped substrate 4, which has an emitter side 31. As shown in FIG. 17 (top view FIG. 26), a trench region 11 is produced by dry etching through a mask opening 111 into the substrate 4. A first oxide layer 12 and second oxide layer 12' are produced completely covering the substrate 4 on the emitter side 31. As shown in FIG. 18 (top view FIG. 27), electrically conductive layers 10 and 11 are produced on top of the first oxide layer 12 and second oxide layer 12' respectively. The electrically conductive layers 10 and 11 cover the first oxide layer 12 and second oxide layer 12' completely. According to FIG. 19 and FIG. 20 (top view FIG. 28) an opening 101 in form of a through hole is etched in the electrically conductive layer 10, resulting in a structured gate electrode layer 10.

Figure 21:
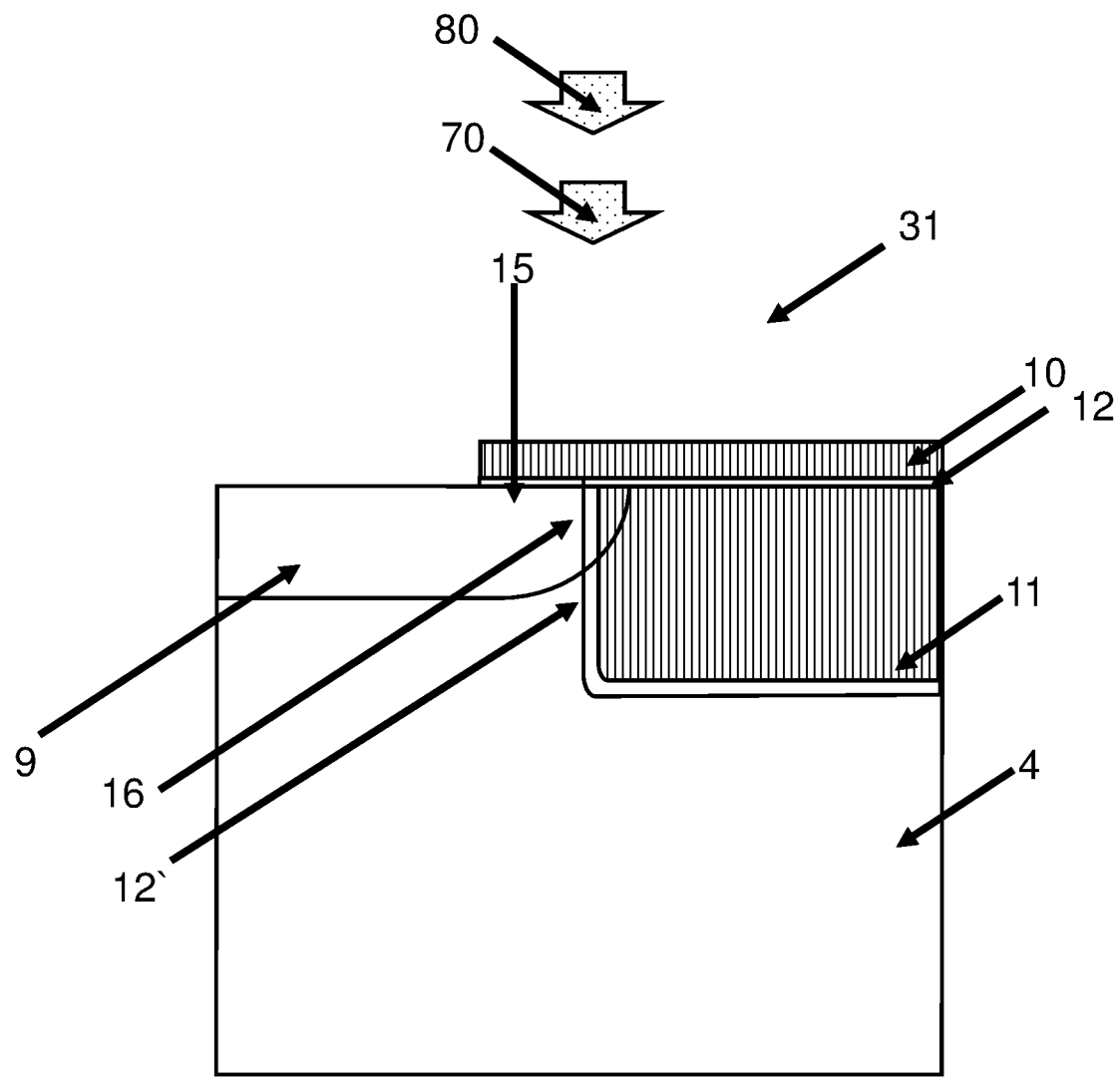

Afterwards, the first dopants of p conductivity type are implanted into the substrate 4 (shown by arrows 90 in FIG. 20) (top view FIG. 29) using the structured gate electrode layer with its opening as a mask, resulting in a first implant region 9. Afterwards, the implanted first dopants are diffused into the substrate 4 as shown in FIG. 21 (top view FIG. 29). The first dopants are preferably Boron ions. The first dopants are preferably implanted with an energy of 20-100 keV and/or a dose of $5\times10^{13}/cm^2$ to $2\times10^{14}/cm^2$. The first dopants are driven into a maximum depth between 1 µm and 5 µm, in particular between 1 and 3 µm and in particular between 1 and 2 µm. As shown in FIG. 21, the first dopants are not only driven into the substrate 4 in a direction perpendicular to the surface, but they are spread out laterally as shown in top view FIG. 29, and will reach the orthogonal trenches 11 to form the series connected planar and trench channels 15 and 16, while reaching out further laterally in the mesa region between the orthogonal trenches 11 to form only the planar channel 15.

Figure 22:
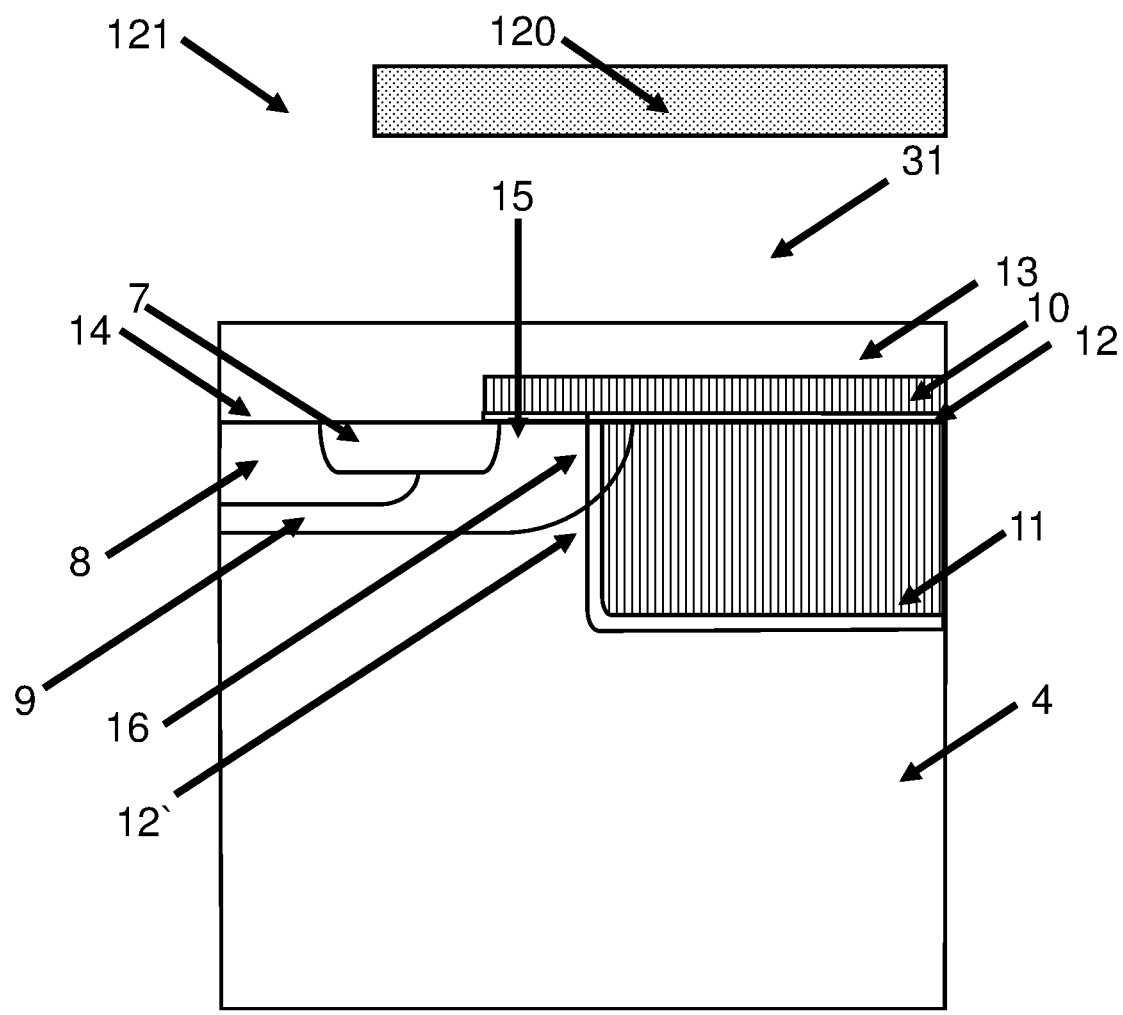

Afterwards, the second dopants of highly doped n conductivity type are implanted 70 into the substrate 4 through a mask or using the structured gate electrode layer with its opening as a mask, resulting in a second implant region 7. Afterwards, the implanted second dopants are diffused into the substrate 4. The second dopants are preferably Phosphorous or Arsenic preferably Arsenic ions. The second dopants are preferably implanted with an energy of 100-160 keV and/or a dose of $1\times10^{15}/cm^2$ to $1\times10^{16}/cm^2$. The second dopants are driven into a maximum depth between 0.5 µm and 1 µm. As shown in FIG. 22 (top view FIG. 30), the second dopants are mainly driven into the substrate 4 in a direction perpendicular to the surface, but they are only slightly spread out laterally to form the critical source region under the gate oxide.

Afterwards, the third dopants of highly doped p conductivity type are implanted 80 into the substrate 4 through a mask opening or using the structured gate electrode layer with its opening as a mask, resulting in a third implant region 8. Afterwards, the implanted third dopants are diffused into the substrate 4. The third dopants are preferably Boron ions. The third dopants are preferably implanted to a higher depth than the second region with an energy of 50-160 keV and/or a dose of $1\times10^{15}/cm^2$ to $1\times10^{16}/cm^2$. The third dopants are driven into a maximum depth between 0.5 µm and 2.5 µm. As shown in FIG. 22 (top view FIG. 30), the third dopants are mainly driven into the substrate 4 in a direction perpendicular to the surface, but they are only slightly spread out laterally to cover a section or all the lower part of the second region and ensure a lateral/horizontal channel can be formed in the planar cell.

Figure 23:
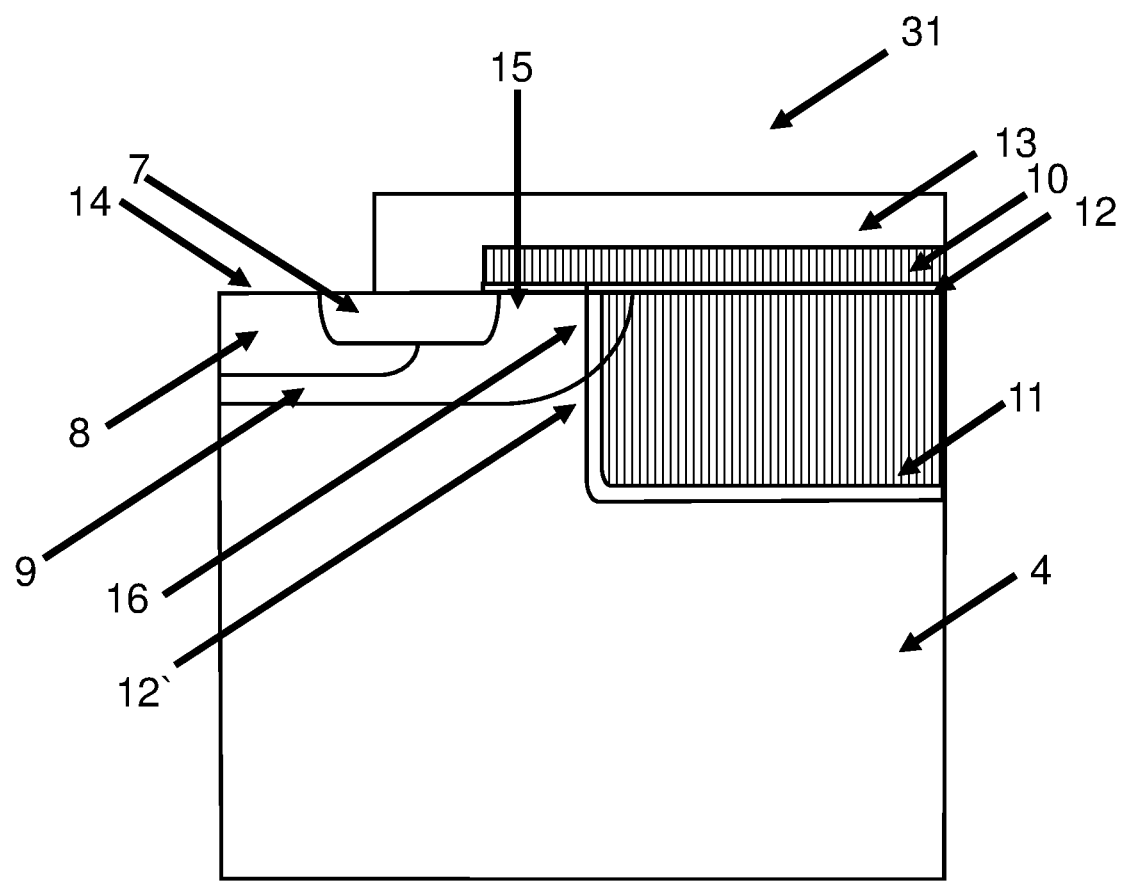
Figure 24:
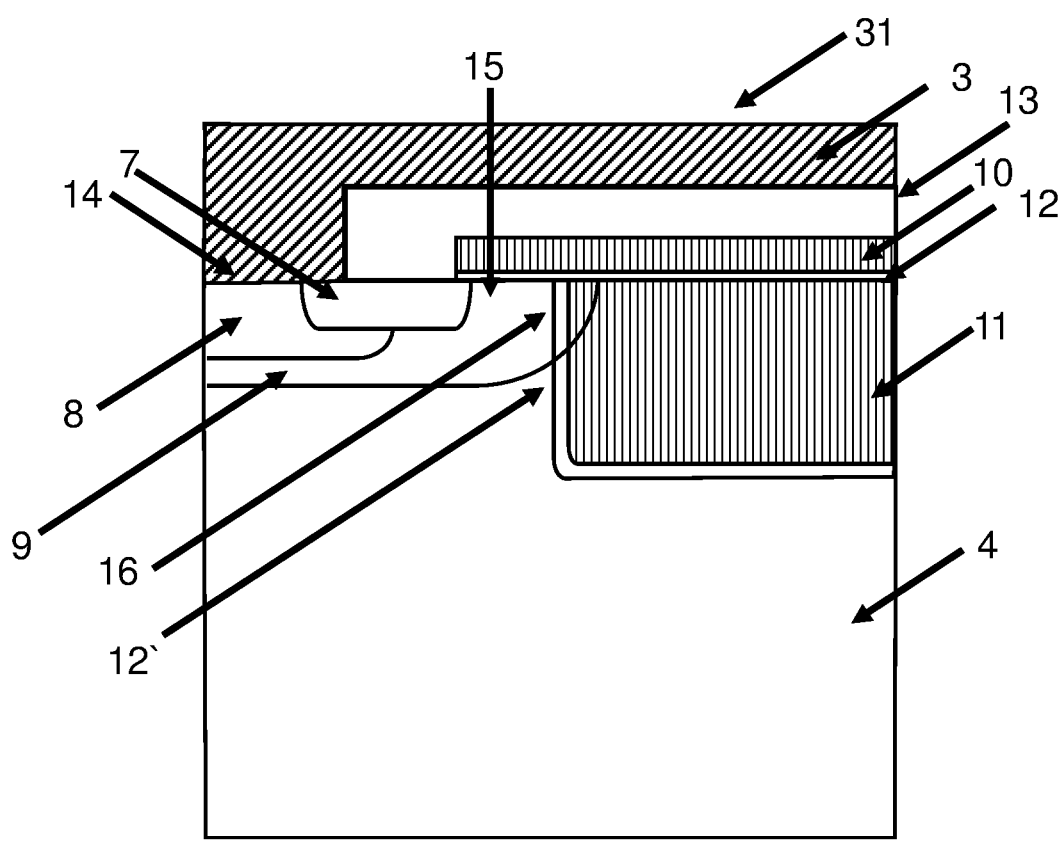
Figure 25:
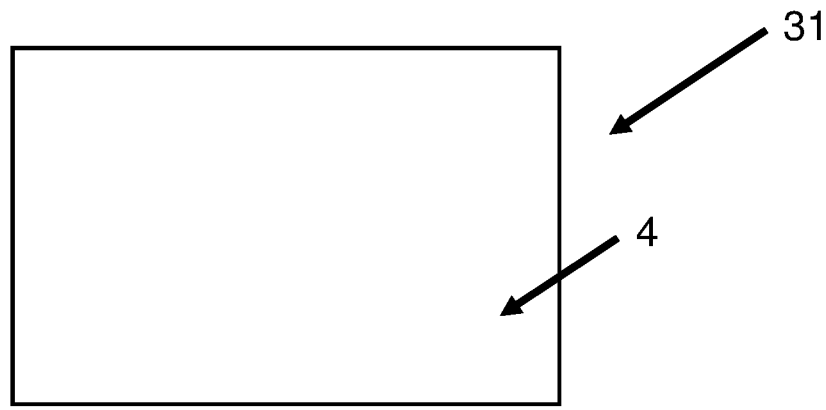
FIGS. 25-31: show a top view of the different steps of the method for manufacturing a semiconductor device according to the invention.
Figure 26:
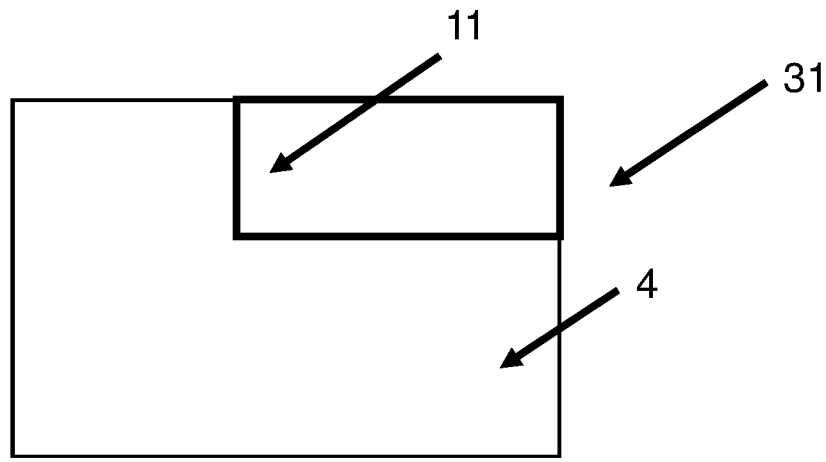
Figure 27:
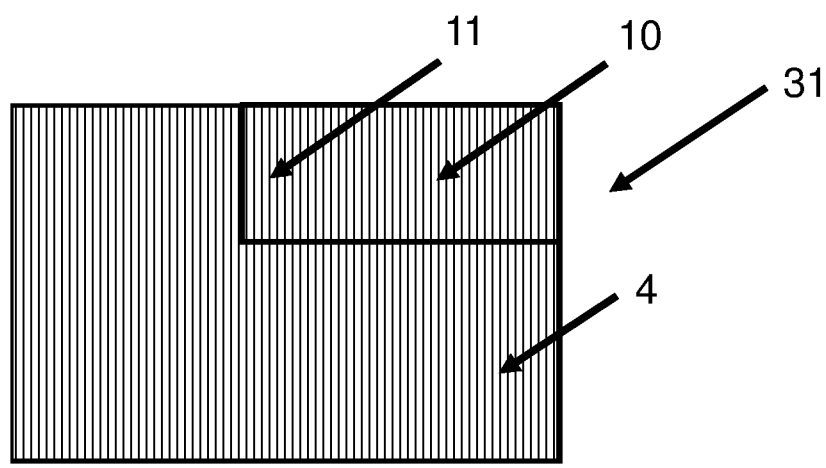
Figure 28:
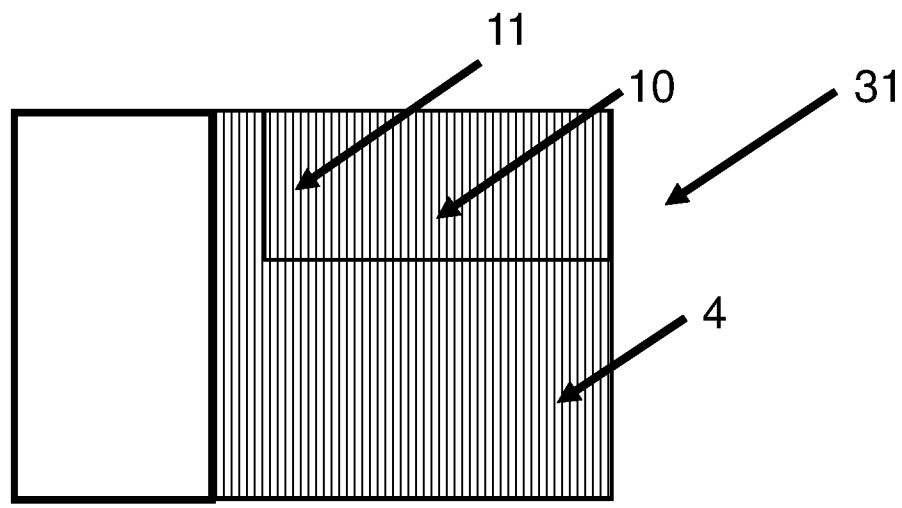
Figure 29:
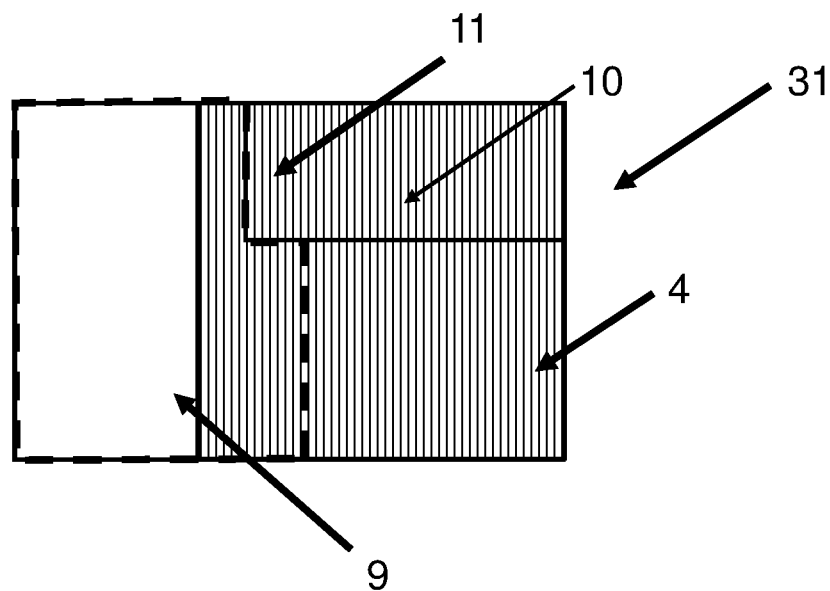
Figure 30:
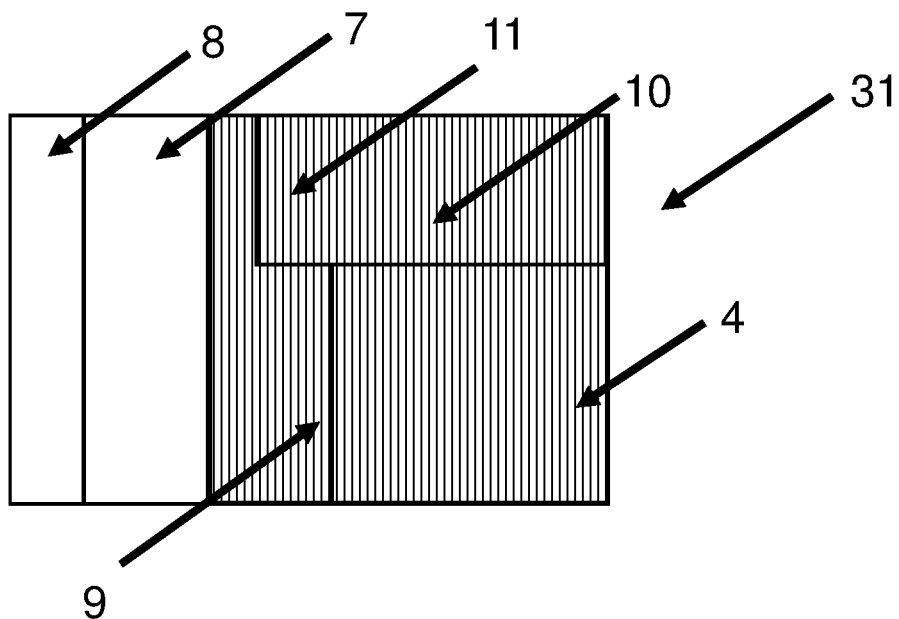
Figure 31:
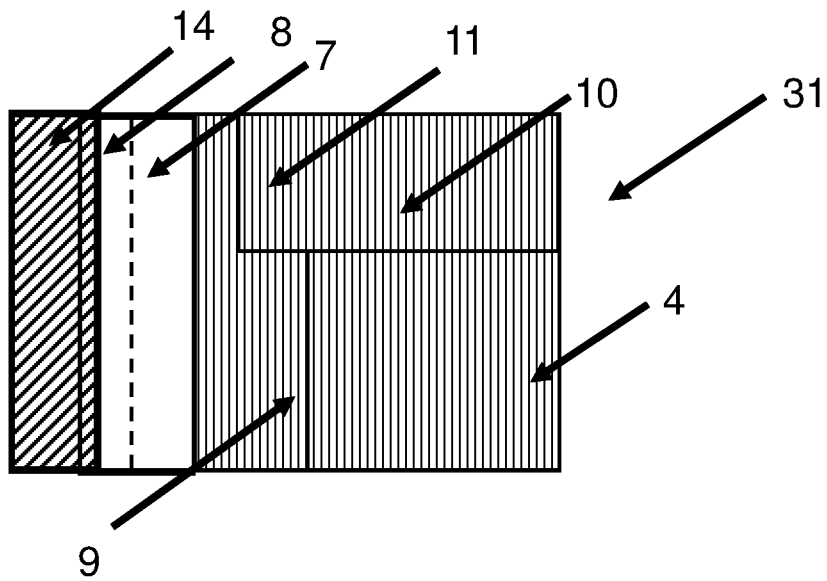

Afterwards, an insulating oxide layer 13 is produced to cover the first main side 31 completely. The insulating oxide layer thickness can range between 500 nm to 1500 nm. A contact opening 14 is then produced by dry etching the insulating oxide layer 13 fully through a mask opening 121 as shown in FIG. 22 to reach the third dopants region 8 as shown in FIG. 23 (top view FIG. 31). The contact opening 14 is filled with metal to produce a direct electrical emitter contact 3 to the second dopants region 7 and third dopants region 8 as shown in FIG. 24.

Figure 32:
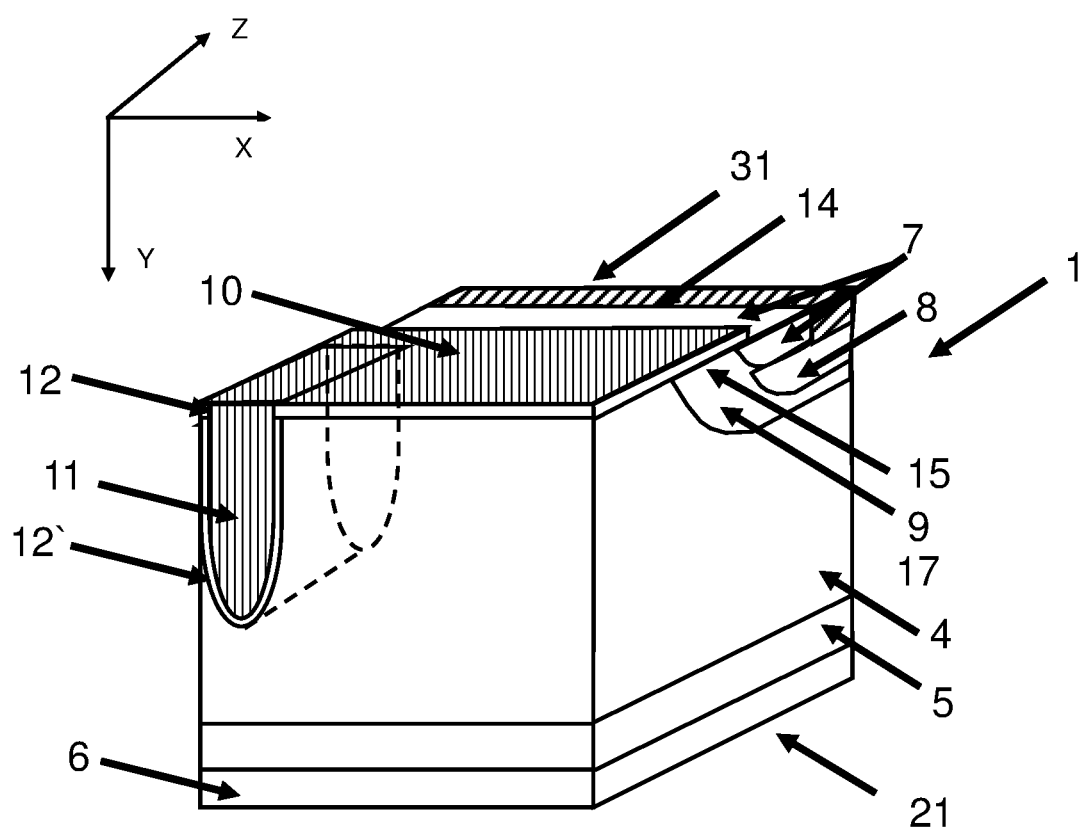
FIG. 32: second exemplary embodiment of a punch through IGBT with extended second base layer under the source region and etched contact through the source region according to the invention.

A second exemplary embodiment consists of a second base layer 8 extended under the source region, together with an etched contact through the source region 7 to reach the second base layer 8 as shown in FIG. 32. The advantage of the second exemplary embodiment is that it does not require the use of the additional masks to structure the source region 7 and second base region 8.

Figure 33:
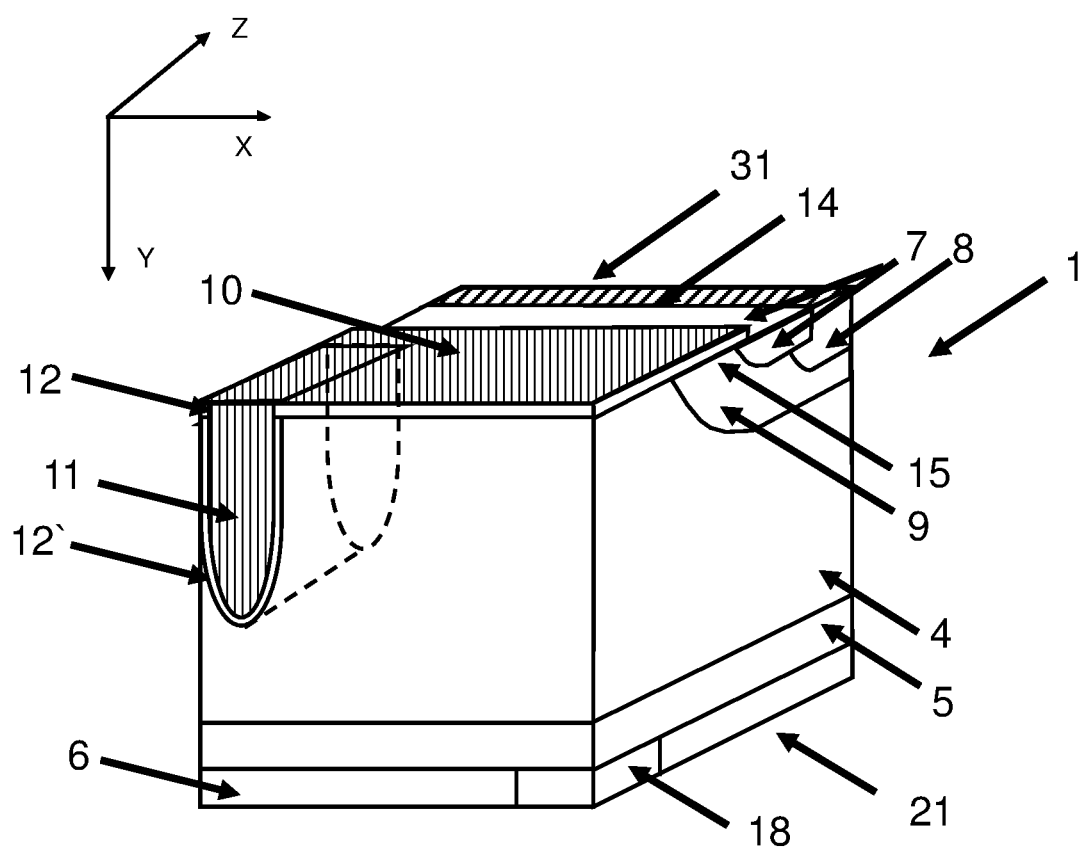
FIG. 33: third exemplary embodiment of a reverse conducting IGBT according to the invention.

The inventive design is also suitable for a reverse conducting structure by introducing n type dopants at the collector side to produce collector shorts 18, and an internal anti-parallel diode structure as shown in FIG. 33.

Figure 34:
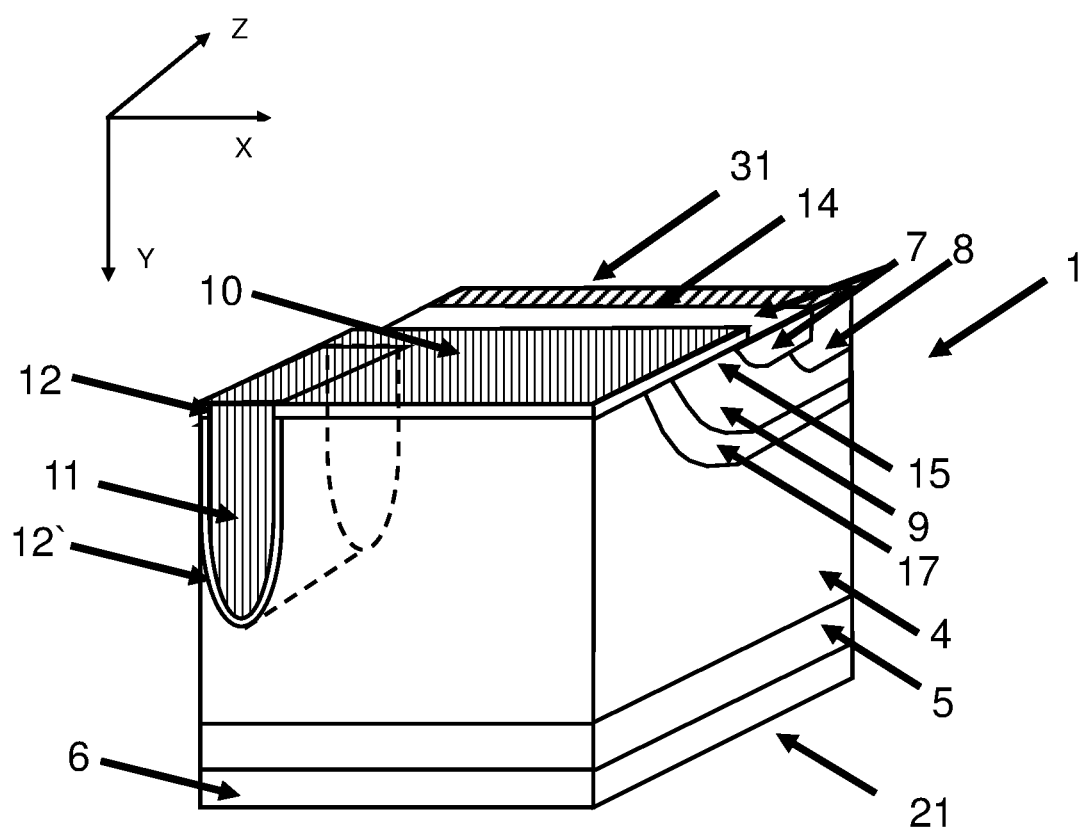
FIG. 34: fourth exemplary embodiment of a punch through IGBT with n-enhancement layer according to the invention

An enhancement layer or fourth dopants of lightly doped n conductivity type can be implanted and diffused before the first dopants implant as shown in FIG. 34. The fourth dopants of n conductivity type are implanted into the substrate 4 using the structured gate electrode layer with its opening as a mask, resulting in a fourth implant region 17. Afterwards, the implanted fourth dopants are diffused into the substrate 4. The fourth dopants are preferably Phosphorous ions. The fourth dopants are preferably implanted with an energy of 20-100 keV and/or a dose of $5\times10^{12}/cm^2$ to $5\times10^{13}/cm^2$. The fourth dopants are driven into a maximum depth between 2 µm and 8 µm, in particular between 2 and 6 µm and in particular between 2 and 4 µm. As shown in FIG. 34, the fourth dopants are not only driven into the substrate 4 in a direction perpendicular to the surface, but they are spread out laterally.

It is possible to apply the invention to a method for the manufacturing of semiconductor devices, in which the conductivity type of all layers is reversed, i.e. with a lightly p doped substrate etc.

REFERENCE LIST

1: inventive planar MOS cell power semiconductor device
3: emitter metallization (electrode)
31: emitter side
2: collector metallization (electrode)
21: collector side
4: drift layer, substrate
5: buffer layer
6: collector layer
7: n-doped source layer
8: p-doped second base layer
9: p-doped first base layer
10: planar gate electrode, electrically conductive layer
10': uncovered gate electrode
11: trench gate electrode, electrically conductive layer
11': trench region gate electrode with different dimensions
12: insulating gate oxide for planar gate
12': insulating gate oxide for trench gate
13: insulation layer for planar cell and trench cell
14: emitter contact opening
15: horizontal channel for planar gate
16: vertical channel for trench gate
17: enhancement layer
18: collector shorts
70: source implantation step
80: second base implantation step
90: first base implantation step
100: electrically conductive layer etch mask
110: electrically conductive layer etch mask opening
111: trench etch mask opening
120: contact etch mask
121: contact etch mask opening
200: planar MOS cell power semiconductor device (prior art)
300: trench MOS cell power semiconductor device (prior art)
400: trench planar MOS cell power semiconductor device (prior art)
401: trench planar MOS cell power semiconductor device (prior art)
500: trench planar MOS cell power semiconductor device (prior art)
600: trench planar MOS cell power semiconductor device (prior art)
700: trench planar MOS cell power semiconductor device (prior art)
800: planar MOS cell power semiconductor device (prior art)

The invention claimed is:

1. A power semiconductor device, comprising an emitter side and a collector side separated in a second dimension, wherein an emitter electrode is operatively connected to the emitter side and a collector electrode is operatively connected to the collector side, and wherein the power semiconductor device further comprises:
   a drift layer of a first conductivity type, arranged between the emitter side and the collector side;
   a first base layer of a second conductivity type, which is arranged between the drift layer and an emitter electrode, the emitter electrode being arranged on the emitter side, wherein the first base layer extends longitudinally in a first dimension in a top view plane;
   a source region of the first conductivity type with a higher doping concentration than a doping concentration of the drift layer,
   wherein the source region is embedded in the first base layer at the emitter side, contacts the emitter electrode and extends longitudinally in the first dimension, and laterally in a third dimension;
   a second base layer of the second conductivity type with a higher doping concentration than a doping concentration of the first base layer, embedded within the first base layer at the emitter side extending deeper than the source region in the second dimension,
   wherein the second base layer contacts the emitter electrode through a contact opening;
   a first gate electrode, arranged on top of the emitter side and electrically insulated from the first base layer, the source region, and the drift layer by a first insulating layer,
   wherein a horizontal MOS channel is formable in first base layer portions directly abutting the first insulating layer;
   wherein lateral extents of the source region and the first gate electrode overlap each other; and
   a plurality of trench regions in the drift layer, each trench region embedding a second gate electrode electrically insulated from the drift layer by a second insulating layer and from the emitter electrode by a third insulating layer, and each trench region extending longitudinally in the third dimension,
   wherein the first base layer does not abut any of the sides of one or more of the plurality of trench regions,
   wherein two adjacent trench regions in the first dimension are separated by a region comprising at least a portion of the drift layer without any portions of the first base layer or the source region, and
   wherein:
   the first base layer is shaped with stripes with their length parallel to the first dimension, and their width parallel to the third dimension in a top view plane,
   the trench regions are shaped with stripes oriented in another dimension orthogonal to the stripes of the first base layer,
   wherein the stripes of the trench regions are interrupted by the regions of the stripes of the first base layer.

2. The power semiconductor device according to claim 1, wherein the first gate electrode and second gate electrodes in the plurality of trench regions are electrically connected.

3. The power semiconductor device according to claim 1, wherein at least some of the plurality of trench regions embed the second gate electrodes which are electrically connected to the emitter electrode.

4. The power semiconductor device according to claim 1, wherein at least some of the plurality of trench regions embed the second gate electrodes which are electrically floating.

5. The power semiconductor device according to claim 1, further comprising a buffer layer of the first conductivity type with a higher doping concentration than the drift layer, arranged between the drift layer and the collector electrode.

6. The power semiconductor device according to claim 1, further comprising:
   a collector layer of the second conductivity type arranged on the collector side between the drift layer and the collector electrode; and/or
   a buffer layer of the first conductivity type with a higher doping concentration than the drift layer arranged on the collector side between the drift layer and the collector electrode.

7. The power semiconductor device according to claim 6, further comprising a reverse conducting type device with a collector short layer of the first conductivity type arranged at the collector side between the collector electrode and the buffer layer.

8. The power semiconductor device according to claim 1, wherein a carrier enhancement layer of the first conductivity type separates the drift layer and the first base layer.

9. The power semiconductor device according to claim 1, wherein a distance between a second wall of a trench region and a first wall of an adjacent trench region in the first dimension is below 5 μm.

10. The power semiconductor device according to claim 1, wherein a distance between adjacent trench regions in the third dimension extends from about 20 μm to about 1 μm.

11. The power semiconductor device according to claim 1, wherein the power semiconductor has a stripe layout design or cellular layout design.

12. The power semiconductor device according to claim 1, wherein the drift layer can be silicon or wide bandgap materials.

* * * * *